(12) United States Patent
Flynn et al.

(10) Patent No.: US 8,151,082 B2
(45) Date of Patent: Apr. 3, 2012

(54) APPARATUS, SYSTEM, AND METHOD FOR CONVERTING A STORAGE REQUEST INTO AN APPEND DATA STORAGE COMMAND

(75) Inventors: David Flynn, Sandy, UT (US); Michael Zappe, Wheat Ridge, CO (US); John Strasser, Syracuse, UT (US); Jonathan Thatcher, Lehi, UT (US)

(73) Assignee: Fusion-IO, Inc., Salt Lake City, UT (US)

( * ) Notice: Subject to any disclaimer, the term of this patent is extended or adjusted under 35 U.S.C. 154(b) by 629 days.

(21) Appl. No.: 12/098,433

(22) Filed: Apr. 6, 2008

(65) Prior Publication Data

US 2009/0150605 A1  Jun. 11, 2009

Related U.S. Application Data

(63) Continuation-in-part of application No. 11/952,098, filed on Dec. 6, 2007.

(51) Int. Cl.
*G06F 12/00* (2006.01)
(52) U.S. Cl. ...................................................... 711/202
(58) Field of Classification Search .................. None
See application file for complete search history.

(56) References Cited

U.S. PATENT DOCUMENTS

| | | | |
|---|---|---|---|
| 4,290,105 A | 9/1981 | Cichelli et al. | |
| 4,584,665 A | 4/1986 | Vrielink | |
| 5,325,509 A | 6/1994 | Lautzenheiser | |
| 5,404,485 A | 4/1995 | Ban | |
| 5,504,882 A | 4/1996 | Chai | |
| 5,535,391 A | 7/1996 | Hejlsberg et al. | |
| 5,594,883 A | 1/1997 | Pricer | |
| 5,754,563 A | 5/1998 | White | |
| 5,893,086 A | 4/1999 | Shmuck et al. | |
| 5,920,869 A | 7/1999 | Wakayama et al. | |
| 6,038,619 A * | 3/2000 | Berning et al. | 710/33 |

(Continued)

FOREIGN PATENT DOCUMENTS
EP  0747822 A2  12/1996
(Continued)

OTHER PUBLICATIONS

"White Paper", S2A9550 Overview, Data Direct Networks, 2007, pp. 1-17.

(Continued)

*Primary Examiner* — Duc Doan
(74) *Attorney, Agent, or Firm* — Kunzler Needham Massey & Thorpe

(57) ABSTRACT

An apparatus, system, and method are disclosed for converting a storage request to an append data storage command. A storage request receiver module receives a storage request from a requesting device. The storage request is to store a data segment onto a data storage device. The storage request includes source parameters for the data segment. The source parameters include a virtual address. A translation module translates the storage request to storage commands. At least one storage command includes an append data storage command that directs the data storage device to store data of the data segment and the one or more source parameters with the data, including a virtual address, at one or more append points. A mapping module maps source parameters of the data segment to locations where the data storage device appended the data packets of the data segment and source parameters.

31 Claims, 18 Drawing Sheets

U.S. PATENT DOCUMENTS

| | | | |
|---|---|---|---|
| 6,069,827 A * | 5/2000 | Sinclair | 365/185.29 |
| 6,105,076 A | 8/2000 | Beardsley et al. | |
| 6,112,319 A | 8/2000 | Paulson | |
| 6,157,963 A | 12/2000 | Courtright, II et al. | |
| 6,262,918 B1 * | 7/2001 | Estakhri et al. | 365/185.33 |
| 6,298,401 B1 | 10/2001 | Anderson | |
| 6,341,289 B1 | 1/2002 | Burroughs et al. | |
| 6,347,341 B1 | 2/2002 | Glassen et al. | |
| 6,374,266 B1 | 4/2002 | Shnelvar | |
| 6,404,647 B1 | 6/2002 | Minne | |
| 6,405,201 B1 | 6/2002 | Nazari | |
| 6,418,509 B1 | 7/2002 | Yanai et al. | |
| 6,424,872 B1 | 7/2002 | Glanzer et al. | |
| 6,449,688 B1 | 9/2002 | Peters et al. | |
| 6,477,617 B1 | 11/2002 | Golding | |
| 6,519,185 B2 | 2/2003 | Harari et al. | |
| 6,526,482 B1 | 2/2003 | Nonoyama et al. | |
| 6,601,151 B1 * | 7/2003 | Harris | 711/158 |
| 6,615,355 B2 | 9/2003 | Mattison | |
| 6,643,748 B1 | 11/2003 | Wieland | |
| 6,751,155 B2 | 6/2004 | Gorobets | |
| 6,754,773 B2 | 6/2004 | Ulrich et al. | |
| 6,754,800 B2 | 6/2004 | Wong et al. | |
| 6,779,045 B2 * | 8/2004 | Kendall et al. | 710/5 |
| 6,779,080 B2 | 8/2004 | Basham et al. | |
| 6,785,768 B2 | 8/2004 | Peters et al. | |
| 6,823,398 B1 | 11/2004 | Lee et al. | |
| 6,839,819 B2 | 1/2005 | Martin | |
| 6,845,428 B1 | 1/2005 | Kedem | |
| 6,850,969 B2 | 2/2005 | Ladan-Mozes et al. | |
| 6,928,505 B1 | 8/2005 | Klingman | |
| 6,988,151 B2 | 1/2006 | Tsuruta | |
| 6,990,553 B2 | 1/2006 | Nakayama et al. | |
| 6,996,676 B2 | 2/2006 | Megiddo | |
| 7,013,364 B2 | 3/2006 | Honda et al. | |
| 7,058,769 B1 | 6/2006 | Danilak | |
| 7,065,618 B1 | 6/2006 | Ghemawat et al. | |
| 7,069,380 B2 | 6/2006 | Ogawa et al. | |
| 7,082,495 B2 | 7/2006 | DeWhitt | |
| 7,096,321 B2 | 8/2006 | Modha | |
| 7,107,419 B1 | 9/2006 | Ghemawat et al. | |
| 7,111,115 B2 | 9/2006 | Peters et al. | |
| 7,155,559 B1 * | 12/2006 | Estakhri et al. | 711/103 |
| 7,162,571 B2 | 1/2007 | Kilian et al. | |
| 7,167,953 B2 | 1/2007 | Megiddo | |
| 7,215,580 B2 | 5/2007 | Gorobets | |
| 7,231,401 B1 | 6/2007 | Inohara et al. | |
| 7,237,141 B2 | 6/2007 | Fredin | |
| 7,240,152 B2 | 7/2007 | Nakayama et al. | |
| 7,243,203 B2 | 7/2007 | Scheuerlein | |
| 7,246,179 B2 | 7/2007 | Camara | |
| 7,254,672 B1 | 8/2007 | Murray et al. | |
| 7,305,520 B2 | 12/2007 | Voigt | |
| 7,340,566 B2 | 3/2008 | Voth | |
| 7,343,465 B2 | 3/2008 | Shibayama et al. | |
| 7,366,808 B2 | 4/2008 | Kano et al. | |
| 7,373,514 B2 | 5/2008 | Krueger et al. | |
| 7,450,420 B2 | 11/2008 | Sinclair | |
| 7,487,320 B2 | 2/2009 | Bansal | |
| 7,529,905 B2 | 5/2009 | Sinclair | |
| 7,552,271 B2 | 6/2009 | Sinclair | |
| 7,644,239 B2 | 1/2010 | Ergan | |
| 7,725,628 B1 | 5/2010 | Phan | |
| 2001/0008007 A1 * | 7/2001 | Halligan et al. | 711/114 |
| 2002/0002661 A1 | 1/2002 | Blumenau et al. | |
| 2002/0035665 A1 | 3/2002 | Basham et al. | |
| 2002/0133743 A1 | 9/2002 | Oldfield et al. | |
| 2003/0061296 A1 | 3/2003 | Craddock | |
| 2003/0065866 A1 | 4/2003 | Spencer | |
| 2004/0044705 A1 | 3/2004 | Stager | |
| 2004/0054867 A1 | 3/2004 | Stravers et al. | |
| 2004/0098544 A1 | 5/2004 | Gaither et al. | |
| 2004/0186946 A1 | 9/2004 | Lee | |
| 2004/0221132 A1 | 11/2004 | Torkelsson et al. | |
| 2004/0236761 A1 | 11/2004 | Both | |
| 2004/0255122 A1 | 12/2004 | Ingerman et al. | |
| 2004/0268359 A1 | 12/2004 | Hanes | |
| 2005/0108292 A1 | 5/2005 | Burton et al. | |
| 2005/0138092 A1 | 6/2005 | Abuaiadh et al. | |
| 2005/0149645 A1 | 7/2005 | Tsuruta | |
| 2005/0223154 A1 | 10/2005 | Uemura | |
| 2005/0228963 A1 | 10/2005 | Rothman et al. | |
| 2005/0235103 A1 | 10/2005 | Saliba et al. | |
| 2005/0240713 A1 | 10/2005 | Wu | |
| 2005/0262150 A1 | 11/2005 | Krishnaswamy | |
| 2005/0283489 A1 | 12/2005 | Shiozawa et al. | |
| 2006/0026341 A1 * | 2/2006 | Lasser | 711/103 |
| 2006/0059326 A1 * | 3/2006 | Aasheim et al. | 711/203 |
| 2006/0059358 A1 | 3/2006 | Galal et al. | |
| 2006/0075057 A1 | 4/2006 | Gildea | |
| 2006/0107127 A1 | 5/2006 | Park et al. | |
| 2006/0136749 A1 | 6/2006 | Satou et al. | |
| 2006/0136779 A1 * | 6/2006 | Lee et al. | 714/11 |
| 2006/0149916 A1 | 7/2006 | Nase | |
| 2006/0161725 A1 * | 7/2006 | Lee et al. | 711/103 |
| 2006/0168154 A1 | 7/2006 | Zhang et al. | |
| 2006/0248387 A1 | 11/2006 | Nicholson | |
| 2006/0288156 A1 * | 12/2006 | Fish et al. | 711/112 |
| 2007/0028051 A1 | 2/2007 | Williamson et al. | |
| 2007/0033376 A1 | 2/2007 | Sinclair et al. | |
| 2007/0050571 A1 | 3/2007 | Nakamura | |
| 2007/0061597 A1 | 3/2007 | Holtzman et al. | |
| 2007/0067326 A1 * | 3/2007 | Morris et al. | 707/101 |
| 2007/0086260 A1 | 4/2007 | Sinclair | |
| 2007/0118676 A1 | 5/2007 | Kano et al. | |
| 2007/0124533 A1 | 5/2007 | Estakhri et al. | |
| 2007/0156998 A1 | 7/2007 | Gorobets | |
| 2007/0198852 A1 | 8/2007 | Choi et al. | |
| 2007/0233937 A1 | 10/2007 | Coulson | |
| 2007/0274150 A1 | 11/2007 | Gorobets | |
| 2007/0283357 A1 | 12/2007 | Jeter et al. | |
| 2007/0300008 A1 | 12/2007 | Rogers | |
| 2007/0300009 A1 * | 12/2007 | Rogers et al. | 711/103 |
| 2008/0010580 A1 | 1/2008 | Anderson et al. | |
| 2008/0046737 A1 | 2/2008 | Mihm et al. | |
| 2008/0077767 A1 | 3/2008 | Khosravi et al. | |
| 2010/0031000 A1 | 2/2010 | Flynn et al. | |

FOREIGN PATENT DOCUMENTS

| | | |
|---|---|---|
| EP | 1607868 A1 | 12/2005 |
| GB | 2431750 A | 5/2007 |
| GB | 2431750 A | 9/2007 |
| WO | 0131512 A2 | 5/2001 |
| WO | 2005010773 A1 | 2/2005 |
| WO | 2006050455 A2 | 5/2006 |

OTHER PUBLICATIONS

Mesnier et al. "Object-Based Storage", IEEE Communications Magazine, Aug. 2003, pp. 84-90.

"SCSI Object-Based Storage Device Commands (OSD)", ANSI, Jul. 30, 2004, pp. 0-74, Part 1 of 3.

"SCSI Object-Based Storage Device Commands (OSD)", ANSI, Jul. 30, 2004, pp. 75-164, Part 2 of 3.

"SCSI Object-Based Storage Device Commands (OSD)", ANSI, Jul. 30, 2004, pp. 165-171, Part 3 of 3.

PCT/US2009/039673, International Search Report and Written Opinion, Jul. 6, 2009.

ASPMC_660, Asine Group, http://www.asinegroup.com/products/aspmc660.html, copyright 2002, downloaded on Nov. 18, 2009.

"BiTMICRO Introduces E-Disk PMC Flash Disk Module at Military & Aerospace Electronics East 2004", BiTMICRO, http://www.bitmicro.com/press_news_releases_20040518_prt.php.

NAND Flash 101: An Introduction to NAND Flash and How to Design it in to Your Next Product, Micron, pp. 1-28, Micron Technology Nov. 2006.

OMF—an object request broker for the process control application domain http://ieeexplore.ieee.org/Xplore/login.jsp?url=/iel5/6433/17161/00792056.pdf?arnumber=792056, 1999.

Object Store, http://www.haifa.ibm.com/projects/storage/objectstore/overview.html, Mar. 16, 2006.

AW Object Request Broker, http://www.struktuur.ee/188000, Jun. 7, 2007.

PCT/US2007/086687, International Search Report and Written Opinion, Sep. 5, 2008.

PCT/US2007/086687, International Preliminary Report on Patentability, Mar. 18, 2009.
PCT/US2009/039626, International Search Report and Written Opinion, Aug. 27, 2009.
BiTMICRO Introduces E-Disk PMC Flash Disk Module at Military & Aerospace Electronics East, May 18, 2004, BiTMICRO, http://www.bitmicro.com/press_news_releases_20040518_prt.php.
PCT/US2009/039626, International Preliminary Report on Patentability_Oct. 21, 2010.
PCT/US2009/039673, International Preliminary Report on Patentability_Oct. 21, 2010.
Kawaguchi, A Flash-Memory Based File System, Advanced Research Laboratory, Hitachi, Ltd., 1995.
Rosenbllum, The Design and Implementation of a Log-structured File System, copyright 1992.
Office Action, U.S. Appl. No. 11/952,098, filed Jan. 7, 2011.
Ari, Gottwals, Henze, "Performance Boosting and Workload Isolation in Storage Area Networks with SANcache", Hewlett Packard Laboratories, Proceedings of the 23rd IEEE/ 14th NASA Goddard Conference on Mass Storage Systems Technologies (MSST 2006), May 2006, pp. 263-273.
Plank, James S, "A Tutorial on Reed-Solomon coding for Fault Tolerance in RAID-like Systems", Dept. of computer Science, Univ. of Tennessee, Sep. 1997, pp. 995-1012.
Morgenstern, David, "Is there a Flash Memory RAID in your Future?", Nov. 2006.
"File System Primer", http://wiki.novell.com/index.php/File_System_Primer, Jul. 2006.
"Method for fault tolerance in nonvolatile storage", Ip.com, IPCOM000042269D, Feb. 2005.
Dan, Singer, Implementing MLC NAND Flash for Cost-Effective, High-Capacity Memory, M-systems White paper, Sep. 2003.
Introduction to Samsungs Linux Flash File System—RFS, Samsung Electronics, Nov. 2006.
Mesnier, Ganger, Riedel, "Object-Based Storage", IEEE Comm Magazine, Aug. 2003.
Hensbergen, "Dynamic Policy Disk Caching for Storage Networking", Nov. 2006.
Office Action, CN Application No. 200780051034.1, Nov. 11, 2010.
Office Action, EP Application No. 07865334.2, Nov. 17, 2010.
ASPMC_660, http://www.asinegroup.com/file aid=agphc2lu ZWdyb3VwchgLEhBEb3dubG9hZGFibGVGaWxIGK6cAQw&attachment=true, Nov. 18, 2009.
Office Action, CN Application No. 200780051034.1, Jul. 6, 2011.
STMicroelectronics, "Bad Block Management in NAND Flash Memories," Application note AN-1819 by STMicroelectronics (Geneva, Switzerland), May 19, 2004.

* cited by examiner

APPARATUS, SYSTEM, AND METHOD FOR CONVERTING A STORAGE REQUEST INTO AN APPEND DATA STORAGE COMMAND

CROSS-REFERENCES TO RELATED APPLICATIONS

This application is a continuation-in-part of and claims priority to U.S. patent application Ser. No. 11/952,098 entitled "Apparatus, System, and Method for Servicing Object Requests within a Storage Controller" and filed on Dec. 6, 2007 for David Flynn, et al., which is incorporated herein by reference.

BACKGROUND OF THE INVENTION

1. Field of the Invention

This invention relates to storing data and more particularly relates to converting a storage request to a data storage device to an append data storage command.

2. Description of the Related Art

Traditional data storage devices, such as disk drives, optical drives, etc. often operate as a random access device to store data. Random access is typically the ability to access an arbitrary element of a sequence in equal time. This differs from sequential access where data is stored sequentially and also accessed sequentially such that access time varies significantly based on location of data. For example, a tape for storing data is a sequential device. Accessing one data element can take a different amount of time since one data element may be located close to the where a read head is located and another data element may take longer to access because the tape must be forwarded or reversed to get to the second data element. A random access device, such as a memory chip, a disk drive, or solid-state storage, operates as a random access device because access time to every data element on the random access device requires approximately the same access time. Random access is desirable because of the predictable nature and efficiency of data access. Some devices, such as memory chips, support both random read and random write, typically supporting the ability to overwrite data with updated data. Some devices, such as flash memory, support random read, but require an entire region of memory to be erased (e.g., an erase block or erase region) before data can be written into the region.

Typically, a file system communicates with a random access storage device using low level commands. The file system manages where the data is placed. The low level commands typically include a physical address and a data length in a command to store or access data. Data in a random access storage device may be updated typically in a read-modify-write operation where data at a particular address is read, modified, and then written to the same location where it was stored.

While the concept of a random access device is desirable, random access may cause problems in certain types of data storage. For example, random access may cause certain locations in the storage device to used much more than other locations. This aspect of random access may be detrimental in flash memory because typically each memory cell in flash memory can only be used a certain number of times before it must be reconditioned or becomes unreliable.

SUMMARY OF THE INVENTION

From the foregoing discussion, it should be apparent that a need exists for an apparatus, system, and method that converts a storage request to an append data storage command. Beneficially, such an apparatus, system, and method would provide the benefits of sequential storage, such as even distribution of data, decreased write times, etc. while emulating random access. The apparatus, system, and method would also allow a storage device to emulate a random access device, allowing file systems to interact with the storage device as it would a disk drive while having no knowledge that the storage device is operating as a streamed, sequential write storage device.

The present invention has been developed in response to the present state of the art, and in particular, in response to the problems and needs in the art that have not yet been fully solved by currently available data storage methods. Accordingly, the present invention has been developed to provide an apparatus, system, and method for converting a storage request to an append data storage command that overcome many or all of the above-discussed shortcomings in the art.

The apparatus to convert a storage request to an append data storage command is provided with a plurality of modules configured to functionally execute the necessary steps of receiving a storage request to store a data segment, translating the storage request to one or more append data storage commands, and mapping storage parameters of the data segment to one or more locations where data created from the data segment was stored. These modules in the described embodiments include a storage request receiver module that receives a storage request from a requesting device. The storage request is to store a data segment of a file or object onto a data storage device. The storage request includes one or more source parameters for the data segment. The source parameters include a virtual address.

The apparatus includes a translation module that translates the storage request to one or more storage commands. At least one storage command includes an append data storage command. Each append data storage command directs the data storage device to store data of the data segment and the one or more source parameters at one or more append points. The one or more source parameters are stored with the data and at least one of the source parameters is a virtual address. The apparatus includes a mapping module that maps one or more source parameters of the data segment to one or more locations in the data storage device where the data storage device appended the data of the data segment and the source parameters.

In one embodiment, storing the one or more source parameters with the data comprises storing the data and the source parameters simultaneously. In another embodiment, the data is stored as a data packet and wherein storing the one or more source parameters with the data comprises storing the source parameters in a data packet header. The data packet header is stored together with the data of the data packet.

In one embodiment, data is stored sequentially within a region of the data storage device and the apparatus includes storing sequence information of the region that identifies when the region was written with data with respect to when other regions were written with data. A storage log for the apparatus includes the sequence information of the regions and the sequence that data is stored in each region. The sequence the data is stored may be implicit from the relative position within the region.

In another embodiment, a physical location of the data of the data segment along with the source parameters stored with the data comprise a primary virtual-to-physical mapping and the mapping created by the mapping module comprises a secondary virtual-to-physical mapping. In this embodiment, the secondary virtual-to-physical mapping may be a transformation of the primary mapping, the transformation intended to improve lookup performance and efficiency. In a further embodiment, the apparatus includes an index rebuild module that rebuilds the secondary virtual-to-physical mapping created by the mapping module for the data segment. The index rebuild module rebuilds the mapping using the primary virtual-to-physical mapping by using one or more of the source parameters stored with the data of the data segment and using the physical location on the data storage device where the data of the data segment is stored.

In one embodiment, the apparatus includes a storage response receiver module that receives one or more storage command responses from the data storage device. The data storage responses include one or more locations where the data storage device appended the data of the data segment and associated source parameters. In the embodiment, the mapping module receives the one or more locations where the data storage device appended the data of the data segment and associated source parameters from the one or more storage command responses. In another embodiment, the translation module further includes a location of the one or more append points in each of the one or more append data storage commands and the mapping module receives the one or more locations where the data storage device appended the data of the data segment from the translation module.

In one embodiment, the append point where data is to be stored is independent of context. In another embodiment, the append point is a next location available to store data in the data storage device subsequent to an end of data stored previously on the data storage device. In another embodiment, data is stored on the data storage device sequentially, such that each data packet of a data segment is stored at a new append point. In another embodiment, the apparatus emulates a random access, logical block storage device storing data as directed by the storage request such that the virtual address of the data segment comprises a logical block address. In a further embodiment, the source parameters include a virtual identifier in addition to the logical block address. The virtual identifier identifies a file or object of the data segment.

In one embodiment, the apparatus includes a compression module that compresses data of an append data storage command prior to storage of the data on the data storage device, where the append data storage command is associated with the data segment. In another embodiment, compression information is stored with the compressed data. In another embodiment, each append data storage command also includes one or more of the source parameters to be stored with the one or more data packets of the data segment.

In one embodiment, the apparatus includes a command reordering module that modifies a sequence that two or more outstanding append data storage commands are executed. In another embodiment, the storage request receiver module receives two or more storage requests and the apparatus includes a request reordering module that reorders a sequence that the two or more storage requests are serviced.

In one embodiment, the storage request received by the storage request receiver module is received substantially without data. In another embodiment, the append data storage command transmitted to the data storage device is transmitted substantially without data. In another embodiment, the one or more source parameters include at least one of a virtual identifier associated with the data segment, a device identifier, a partition identifier, lengths of the one or more data packets of the data segment, one or more memory locations in a memory of a host where the data segment is located prior to or subsequent to the storage request, one or more lengths of data in the one or more memory locations, attributes of the data segment, metadata of the data segment, and control parameters of the data segment.

In one embodiment, the source parameters include one or more physical memory addresses where the data segment is read from as a result of the storage request. In another embodiment, at least one of the storage request and the one or more append data storage commands initiate a direct memory access ("DMA") process or a remote DMA ("RDMA") process to transfer data of the data segment to the data storage device. In another embodiment, at least a portion of one or more of the storage request receiver module, the translation module, storage command transmission module, and the mapping module is located within one or more of the requesting device, the data storage device, a storage device controller, and a computing device separate from the requesting device, the data storage device, and the storage device controller.

In one embodiment, the apparatus includes a garbage collection module that moves valid data and associated source parameters from a storage region on the data storage device identified for recovery and that erases data from the storage region prior to returning the storage region to a pool of available space within the data storage device for subsequent data storage. In the embodiment, the mapping module remaps the one or more source parameters of the valid data to one or more new locations where the data storage device appended the valid data and the associated source parameters.

In one embodiment, the one or more append storage commands may include one or more of a set append point command, a read command, an erase command, a reset command, a move command, a sync command, a flush command, a read control register command, a modify control register command, a program page command, an erase command, a transfer command list command, and a request status command. In another embodiment, the apparatus includes a response transmission module that transmits a storage request response to the requesting device, the storage request response comprising information regarding execution of the storage request.

A system of the present invention is also presented to convert a storage request to an append data storage command. The system may be embodied by a data storage device and a storage controller controlling the data storage device. In particular, the system, in one embodiment, includes a storage request receiver module that receives a storage request from a requesting device. The storage request is to store a data segment of a file or object onto a data storage device. The storage request includes one or more source parameters for the data segment. The source parameters include a virtual address.

The system includes a translation module that translates the storage request to one or more storage commands. At least one storage command includes an append data storage command. Each append data storage command directs the data storage device to store data of the data segment and the one or more source parameters at one or more append points. The one or more source parameters are stored with the data and at least one of the source parameters is a virtual address. The system includes a mapping module that maps one or more source parameters of the data segment to one or more locations in the data storage device where the data storage device appended the data of the data segment and the source parameters.

In one embodiment, the requesting device is a client in communication with the storage controller over a computer network. In another embodiment, one or more of the storage request receiver module, the translation module, storage command transmission module, and the mapping module operate independent of the client. In another embodiment, the system includes a server and the storage controller is within the server. In yet another embodiment, the data storage device is a solid-state storage device where the one or more data packets of the data segment are stored in the solid-state storage.

A method of the present invention is also presented for converting a storage request to an append data storage command. The method in the disclosed embodiments substantially includes the steps necessary to carry out the functions presented above with respect to the operation of the described apparatus and system. In one embodiment, the method includes receiving a storage request from a requesting device. The storage request is a request to store a data segment of a file or object onto a data storage device. The storage request includes one or more source parameters for the data segment. The source parameters include a virtual address.

The method includes translating the storage request to one or more storage commands. At least one storage command includes an append data storage command. Each append data storage command directs the data storage device to store data of the data segment and the one or more source parameters at an append point. The one or more source parameters are stored with the data and at least one of the source parameters is a virtual address. The method includes mapping the one or more source parameters of the data segment to one or more locations in the data storage device where the data storage device appended the data of the data segment and the source parameters.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1:
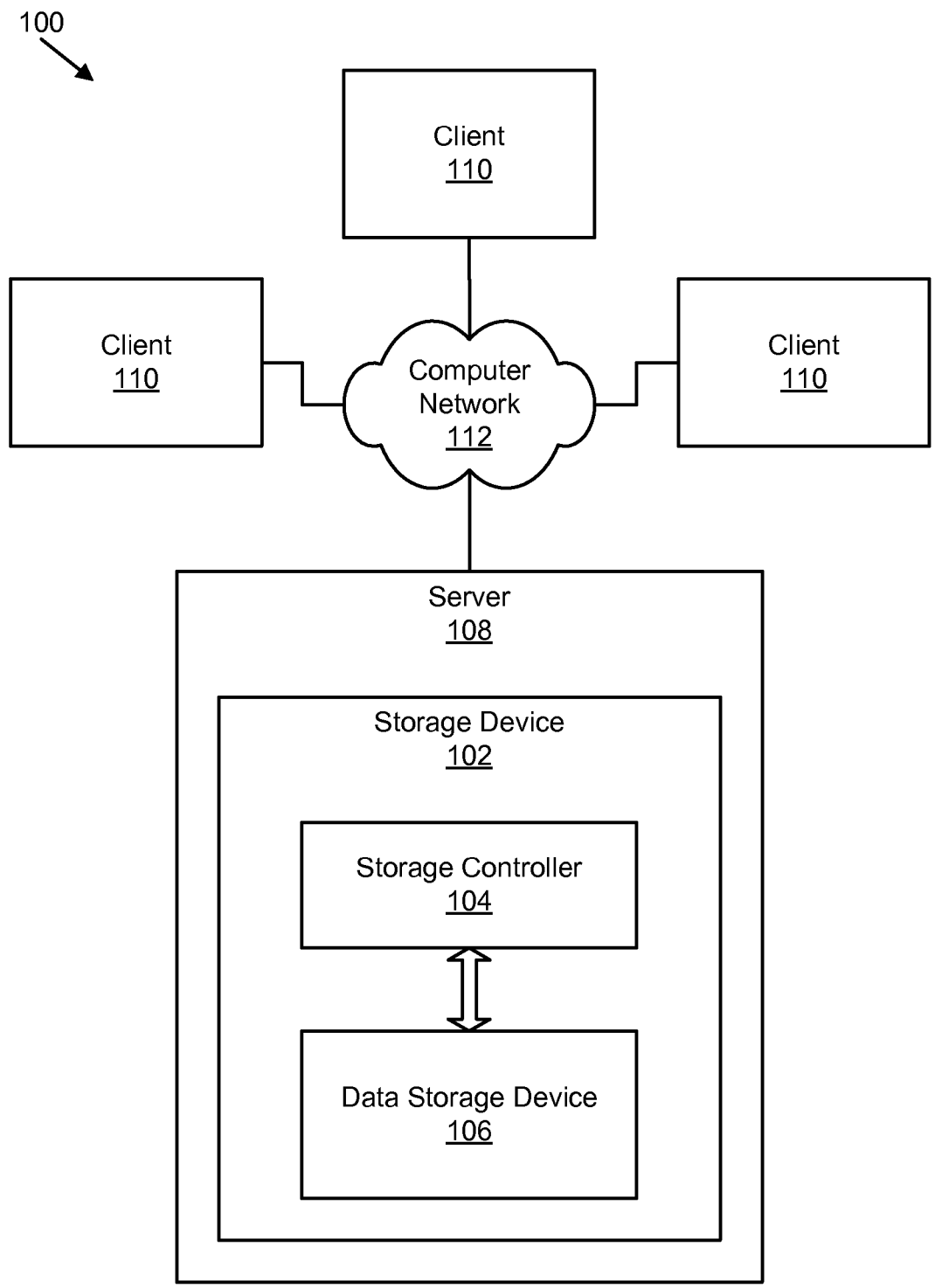
FIG. 1 is a schematic block diagram illustrating one embodiment of a system for converting a storage request to an append data command in accordance with the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus. A computer readable medium may be embodied by a transmission line, a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

FIG. 1 is a schematic block diagram illustrating one embodiment of a system 100 for converting a storage request to an append data command and to efficiently map physical and virtual addresses in accordance with the present invention. The system 100 includes a storage device 102 that includes a storage controller 104 and a data storage device 106. The storage device 102 is within a server 108 connected to one or more clients 110 through a computer network 112.

In one embodiment, the system 100 includes a storage device 102 with a storage controller 104 and a data storage device 106. The storage controller 104 and data storage device 106 may be included in a single enclosure that is the storage device 102. In another embodiment, the storage controller 104 and the data storage device 106 are separate. The storage controller 104 typically controls data storage and access for the data storage device 106. The data storage device 106, in one embodiment, is capable of substantially similar access times to data throughout the data storage device 106. For example, the data storage device 106 may be a solid-state storage device, such as flash memory, nano random access memory ("nano RAM or NRAM"), magneto-resistive RAM ("MRAM"), dynamic RAM ("DRAM"), phase change RAM ("PRAM"), etc. The data storage device 106 may also be a hard disk drive, a compact disk ("CD") drive, an optical drive, and the like.

While the data storage device 106 is depicted in FIG. 1 as a single storage device, the data storage device 106 may include two or more storage devices. The data storage devices 106 may be configured as a redundant array of independent drives ("RAID"), just a bunch of disks ("JBOD"), and the like. The data storage devices 106 may be configured with one or more data storage devices 106, such as solid-state storage, configured as high-performance, short-term storage and one or more data storage devices 106, such as hard disk drives, configured as lower-performance, long-term storage. In this embodiment, the storage controller 104 may manage the various types of data storage devices 106. One of skill in the art will appreciate other types and configurations of data storage devices 106.

The storage controller 104 may control one or more data storage devices 106 and may be a RAID controller, a controller for a storage area network ("SAN"), etc. The storage controller 104 may include one or more sub-controllers. The storage controller 104 may be integrated with the data storage device 106 or separate and may be integrated together or distributed. For example, a portion of the storage controller 104 may be a master controller and other portions of the storage controller 104 may be sub-controllers or slave controllers. The master controller may be a device in communication with other sub-controllers that in turn control data storage devices 106, or may be a master controller that controls slave controllers as well as a data storage device 106. One of skill in the art will recognize other forms and functions of a storage controller 104.

In one embodiment, the storage device 102 is included in a server 108. In various embodiments, either the storage controller 104 or data storage device 106 or both may be located external to the server 108. The server 108 may be connected to the storage controller 104 or the storage controller 104 may be connected to the data storage device 106 over a system bus, such as, such as a peripheral component interconnect express ("PCI-e") bus, a Serial Advanced Technology Attachment ("serial ATA") bus, or the like. In another embodiment, the solid-state storage device 102 is external to the server 108 or storage device 102 and may be connected through a universal serial bus ("USB") connection, an Institute of Electrical and Electronics Engineers ("IEEE") 1394 bus ("FireWire"), etc. In other embodiments, the storage device 102 is connected to the server 108 or the storage controller 104 is connected to the data storage device 106 using a peripheral component interconnect ("PCI") express bus using an external electrical or optical bus extension or networking solution such as Ethernet, Fibre Channel, Infiniband, or PCI Express Advanced Switching ("PCIe-AS"), or the like. One of skill in the art will recognize a wide variety of possible connection methods.

The server 108 may also instead be a personal computer, lap-top computer, mainframe computer, workstation, electronic device, etc. The server 108 may include a client 110 or be connected to a client 110 over a computer network 112. The system 100 may include any number of computers, clients 110, computer networks 112, or other electronic device, as long as the system 100 is capable of transmitting a storage request to the storage device 102. The client 110 may be a process running on the server 108 or on another computer or electronic device. The client 110 may also be a personal computer, lap-top computer, mainframe computer, workstation, electronic device, etc. One of skill in the art will recognize other components and configurations of a system 100 capable of transmitting a storage request to the storage device 102.

Figure 2:
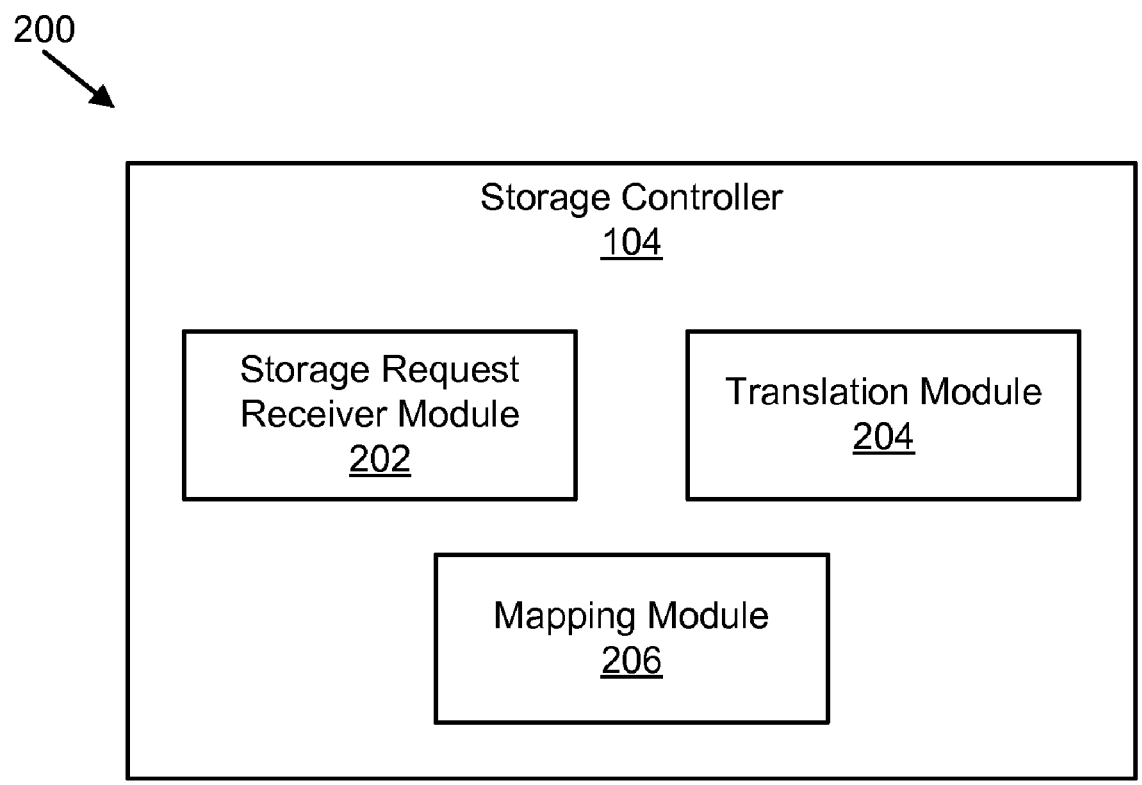
FIG. 2 is a schematic block diagram illustrating one embodiment of an apparatus for converting a storage request to an append data command in accordance with the present invention.

FIG. 2 is a schematic block diagram illustrating one embodiment of an apparatus 200 for converting a storage request to an append data command in accordance with the present invention. The apparatus 200 includes a storage request receiver module 202, a translation module 204, and a mapping module 206, which are described below. The apparatus 200 is depicted in FIG. 2 as being in the storage controller 104, but all or a portion of the modules 202, 204, 206 may be located external to the storage controller 104 and may be distributed through various components of the system 100.

The apparatus 200 includes a storage request receiver module 202 that receives a storage request from a requesting device. In one embodiment, the requesting device is the server 108. In another embodiment, the requesting device is a client 110. The requesting device may be any device capable of sending a storage request.

The storage request includes a request to store a data segment of a file or of an object onto the data storage device 106. The storage request may be an object request, a file request, a logical block storage request, and the like. The storage request includes one or more source parameters for the data segment. The source parameters include a virtual address of a file or object from which the data of the data segment was derived. Typically a virtual address is an identifier for a file or object. The virtual address may be file name, an object name, or other identifier known to a file system connected to the storage device 102.

A distinction is made between a logical address and logical address space and a virtual address and a virtual address space. In the present context, a virtual address space is intended to encompass the broadest possible range of indirect addressing. As used herein, a virtual address space may simultaneously comprise: one or more virtual address spaces, one or more logical address spaces, one or more memory spaces, one or more logical block address spaces, one or more fixed block address spaces, etc.

For example, a client may be operating multiple virtual operating systems. In this embodiment, each virtual operating system may have a virtual memory space. Each of these virtual memory spaces may be mapped to data stored within the storage device according to the device's virtual address space and virtual-to-physical mappings. In another example, objects within several clients may be independently mapped to the same stored data in a many-to-one relationship, referencing the shared data with virtual addresses unique to the client. While examples shown herein are one-to-one relationships, the methods, apparatuses, and systems are intended to support many-to-one, one-to-many, and even many-to-many virtual-to-physical address mappings.

It is intended that the virtual-to-physical mapping methods support sparse addressing (over-provisioning of the physical address space), thin provisioning, virtual partitions, and data transformations (e.g. compression, encryption) by supporting broad indirection in identification, address, length, and metadata transformation.

As a convention herein, a virtual ID uniquely identifies the stored data entity within the virtual space of the client. A virtual address more specifically addresses the data for the virtual entity. For example, a virtual address may comprise a virtual ID and an offset within the dataset. In another example, a virtual address may comprise a virtual ID and an index within the virtual entity, where the index may be to a record within a structure of non-uniform (e.g. variable length) records.

In one embodiment, the apparatus 200 emulates a logical block storage device and the source parameters include one or more logical block addresses where the data segment is requested to be stored by the requesting device through storage request. In this embodiment, the virtual address may comprise the logical block addresses. For example, if the storage request is a logical block storage request, the requesting device may dictate where the data segment is intended to be stored in the data storage device 106. The logical block address may include information such as a RAID group number, data storage device identifier, partition, cylinder number, sector, offset, etc. One of skill in the art will recognize other elements that may be included in a logical block address.

The storage request may include a request to store the data segment in more than one location or may include a request to store portions of the data segment in more than one location, so the storage request may include more than one logical block address. Where a storage request includes a logical block address, the storage request typically also includes one or more offsets and data lengths corresponding to the one or more logical block addresses. An offset and data length may be implicit if the logical blocks are of fixed size. An offset is typically how far into a file or object, typically from a beginning of the file or object, a data segment begins. The data lengths typically include how much of a storage device will be occupied by the data segment or a portion of the data segment associated with a logical block address. Typically, the offset and data length will be expressed using some unit recognizable to the storage controller 104 and data storage device 106. For example, an offset and a data length may be expressed in terms of bytes, blocks, sectors, or other unit used to divide the data storage device 106. One of skill in the art will recognize other ways to express an offset and a data length for all or a portion of a data segment.

The system 100 includes a translation module 204 that translates the storage request to one or more storage commands where at least one storage command is an append data storage command. Each append data storage command directs the data storage device 106 to store data created from the data segment and one or more source parameters at one or more append points. The source parameters are stored with the data and at least one of the source parameters is a virtual address.

The data storage device 106 preferably stores data as a data packet. A data packet includes data of the data segment along with a data packet header. In one embodiment, the data packet header includes source parameters. In another embodiment, the source parameters are stored simultaneously with the data. For example, the data may be stored sequentially at an append point in one location on the data storage device while the source parameters are stored simultaneously and sequentially at another location in the data storage device. In the embodiment, the sequence in which the source parameters and data are stored may be used to pair the data and source parameters during a read operation or other operation where the data and source parameters are retrieved.

In one embodiment, the data storage device 106 stores data (or data packets) sequentially by storing data in a page, division, or other specified region, moving an append point to the next available address just past the end of the previously stored data, storing data at the append point, again moving the append point to the next available address past the data just stored, etc. Data is stored in a page, division, etc. until the page or division is full, then the append point is moved and the data is stored in another page, division, etc. Append points may be moved independently by the storage device 102, and in response to specific requests.

Sequentially storing data is particularly beneficial for solid-state storage devices because it allows even distribution of data to prevent hot spots or addresses that are written to more frequently than other addresses. Sequentially storing data is particularly beneficial for solid-state storage devices as it eliminates seek times, eliminates read-modify-write operations with related erasures and thus increases data reliability and the useful life of the solid-state storage device. Sequential storage in a solid-state storage device also typically does not adversely impact read access time because a typical solid-state storage device has about the same read access time for data stored anywhere in the solid-state storage device. This feature allows the data storage device 106 to emulate a random access device to effectively eliminate latencies due to write seek times and increase the media reliability and useful life of the solid-state storage device 106, without negatively impacting read performance.

Sequential storage may have other benefits as well for the data storage device 106. The benefits of sequential storage as related to access time are more fully described in the U.S. patent application Ser. No. 11/952,095 entitled "Apparatus, System, and Method for Managing Commands of Solid-State Storage Using Bank Interleave" and U.S. patent application Ser. No. 11/952,101 entitled "Apparatus, System, and Method for Storage Space Recovery In Solid-State Storage" [hereinafter "Storage Space Recovery Application"], both for David Flynn et al. and filed Dec. 6, 2007, both herein incorporated by reference.

One significant benefit is that by storing data sequentially and by storing the source parameters with the data (in a packet header or simultaneously) the data storage device 106 a log storage device. A log storage device typically keeps track of a sequence or order of data storage so that if a first data packet is stored after a second data packet, this order of storage is known and can be determined.

In one embodiment, an append point where data is to be stored is independent of context. Whereas data is stored sequentially, an append point may be maintained by the storage device so that data received in conjunction with a storage request may be stored at the next available physical location within the data storage log. There is no external context to this append point. Meaning that data is not stored in different physical regions of the device according to a explicit or implicit relationship with the client. For example, a first client may access the device using a first partition while a second client access the device using a second partition. These partitions are strictly logical constructs within the virtual addressing scheme. The data for the two clients, in the two disparate partitions, is still appended sequentially. In this way, the device does not limit the number of open files, or thereby the number of clients that can access the device simultaneously. An additional benefit is that the storage space is used with optimal efficiency and naturally supports storage methods to improve capacity utilization such as thin provisioning.

An append point is typically set to an address just after previously stored data or data packets, but in other embodiments, may be set at a beginning address of a page, erase block, division, etc., may be set just after a block of addresses that are unusable, etc. In one embodiment, the data storage device 106 maintains an address of the append point and the translation module 204 merely creates an append data storage command directing the data storage device 106 to store data at the append point. Once data is stored, the data storage device 106 then reports the physical address where the data was stored to the mapping module 206 or to another device or module. In another embodiment, the translation module 204 is aware of or maintains the physical address in the data storage device 106 of the append point and creates an append data storage command using the physical address of the append point.

In one embodiment, an append point, or erase region pointer, indicating a next erase region (or erase block) to be written to after the current erase region is filled may be queued up in advance and pulled from the queue by the data storage device 106 or the translation module 204. In another embodiment, the append point (erase region pointer) is moved from sub-region to sub-region according to a prescribed pattern. The prescribed pattern may comprise the region sequence information.

The append data storage command is typically a command to store data at an append point. The data is created from a data segment and typically the data of a data segment spans the data segment. The translate module 204 may create one or more append data storage commands. For example, if a data segment is broken up and more than one portion of the data are stored in non-contiguous locations, more than one append data storage command may be required. In another embodiment, a single append data storage command is capable of storing the data segment in multiple, non-contiguous locations.

The data of the data segment may come from various sources. In one embodiment, the data is data from a file that is new and not previously stored on the data storage device 106. In another embodiment, the data of the data segment has been read from the data storage device 106 and has been modified prior to storing the data again as data packets in the data storage device 106. In another embodiment, the data of the data segment is from another erase region (such as an erase block), page, division, etc. being recovered in a storage recovery (garbage collection) operation. In the embodiment, the data may be valid data that is moved from a selected erase region prior to taking action to recover the erase region for future data storage. In another embodiment, the data is index data or mapping data that is being stored to protect an index or map. One of skill in the art will recognize other data that may be in a data segment received by the storage request receiver module 202.

In various embodiments, the translation module 204 creates other commands relevant to the storage request. For example, the translation module 204 may create a set append point command, a read command, an erase command, a reset command, a move command, a sync command, a flush command, a read control register command, a modify control register command, a program page command, an erase command directed at an erase block, a transfer command list command, a request status command, or the like. The other commands typically supplement the append data storage command to service the storage request. One of skill in the art will recognize other relevant commands and a sequence of commands that may be created by the translate module 204 to service a storage request.

In one embodiment, the storage request received by the storage request receiver module 202 is received substantially free of data. In this case, the storage request is a request to transfer data and essentially does not include the data. In another embodiment, the append data storage command is transmitted to the data storage device 106 substantially without data. In this case, the append data storage command is a command to transfer data and essentially does not include the data. In a further embodiment, the source parameters include one or more physical memory addresses within a host or client 110 where the data segment is read from as a result of the storage request. In the embodiment, the storage request or command created by the translate module 204, such as the append data storage command, initiates or requests a direct memory access ("DMA") or remote direct memory access ("RDMA") process to transfer data of the data segment to the data storage device 106. For example, a DMA process may be initiated by an append data storage command to DMA data from a client 110 to a location within the data storage device 106. One of skill in the art will appreciate other ways to initiate or request a DMA or RDMA process.

In a typical DMA or RDMA process, the data storage device 106 pulls data from memory of a host during a write operation and pushes data to the host during a read operation. This is beneficial because the host does not need to know where the data will be stored on the data storage device 10. The host can merely tell the storage device 102 where data to be written is to be pulled from or where the data is to be stored for a read.

The apparatus 200 includes a mapping module 206 that maps one or more source parameters of the data segment to one or more locations in the data storage device 106 where the data storage device 106 appended the data of the data segment and the source parameters. The source parameters may include a virtual identifier associated with the data segment, a device identifier, a partition identifier, lengths of one or more data packets of the data segment, one or more memory locations in a memory of a host where the data segment is located prior to or subsequent to the storage request, one or more lengths of data in the one or more memory locations, attributes of the data segment, metadata of the data segment, control parameters of the data segment, and the like.

The mapping between the source parameters of the data segment to the physical locations where data of the data segment was stored beneficially allows the apparatus 200 to emulate a random access device using a data storage device 106 where data is stored sequentially. This is beneficial because a storage device 102 or storage controller 104 with the apparatus 200 can be connected as a random access device and can receive object requests, file requests, and logical block storage requests without differentiating between the requests. The apparatus 200 treats data from the various requests equally—mapping a logical block address received in a storage request in essentially the same way as a virtual address. In other words, a logical block address, data length, etc. received in a logical block storage request may become a virtual address to be mapped to a physical address of a location where data of the data request is stored on the data storage device 106.

Figure 3:
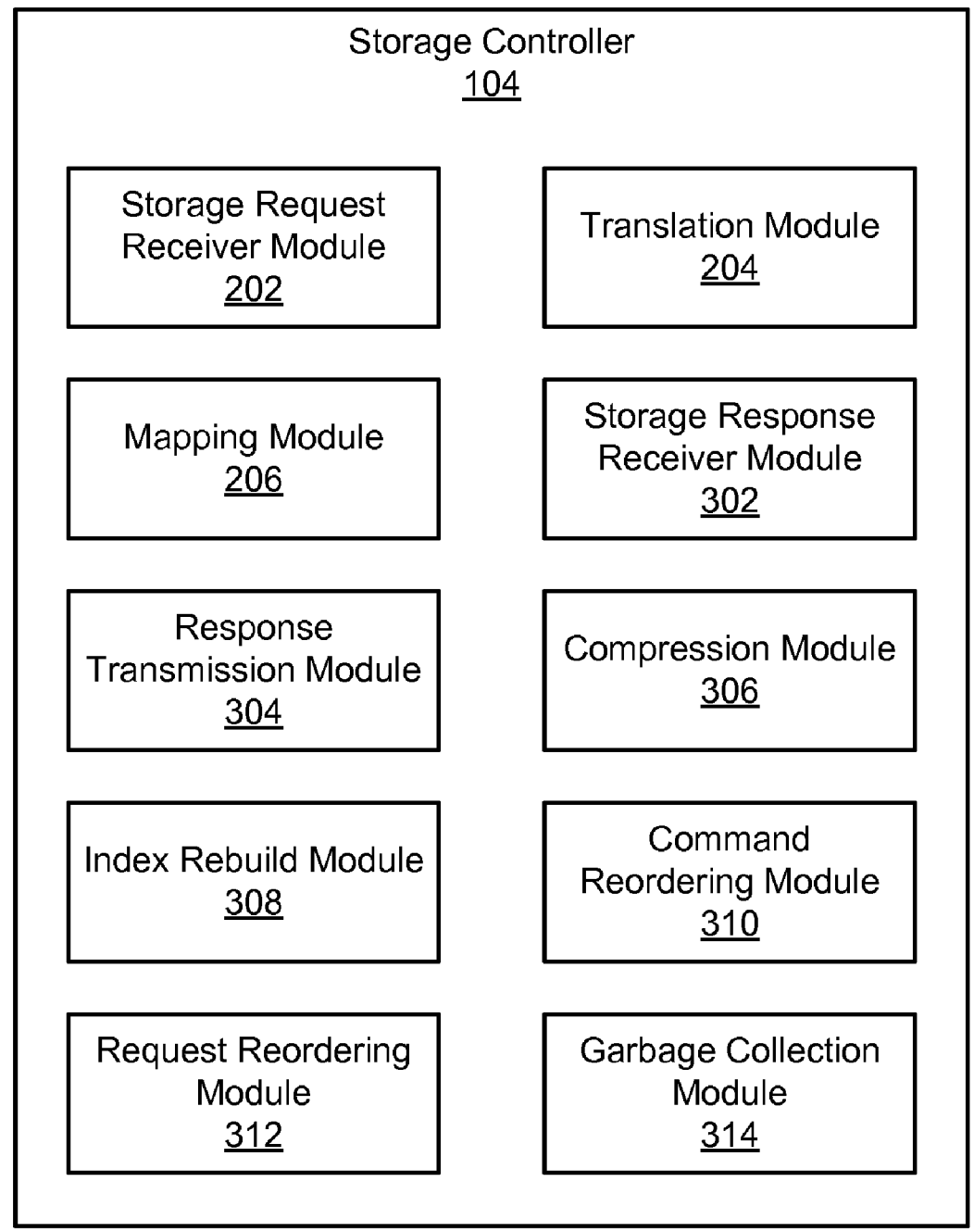
FIG. 3 is a schematic block diagram illustrating one embodiment of an alternate apparatus for converting a storage request to an append data command in accordance with the present invention.

FIG. 3 is a schematic block diagram illustrating one embodiment of an alternate apparatus 300 for converting a storage request to an append data command in accordance with the present invention. The apparatus 300 includes a storage request receiver module 202, a translation module 204, and a mapping module 206, which are substantially similar to those describe above in relation to the apparatus 200 of FIG. 2. The apparatus 300 includes a storage response receiver module 302, a response transmission module 304, a compression module 306, an index rebuild module 308, a command reordering module 310, a request reordering module 312, and a garbage collection module 314, which are described below. The apparatus 300 is depicted in FIG. 3 as being in the storage controller 104, but all or a portion of the modules 202, 204, 206, 302-314 may be located external to the storage controller 104 and may be distributed through various components of the system 100. In addition the modules 202-206, 302-314 of the apparatus 300 may operate independent of the client 110.

In one embodiment, the apparatus 300 includes a storage response receiver module 302 that receives one or more storage command responses from the data storage device 106. The storage command responses include one or more locations where the data storage device 106 appended the data of the data segment. In the embodiment, the locations where the data storage device 106 stored the data may be unknown to the apparatus 300 until the data storage device 106 responds and indicates the locations where the data was appended. When the physical locations where the data storage device 106 appended the data is unknown until after the data storage device 106 stores the data, the mapping module 206 receives the one or more locations where the data storage device 106 appended the data of the data segment from the data storage device 106, typically from the one or more storage command responses. In another embodiment, as discussed above, the translation module 204 tracks or manages physical addresses where the data of the data segment are stored and the mapping module 206 may receive the physical addresses of the locations where the data was stored from the translation module 204.

In another embodiment, the apparatus 300 includes a response transmission module 304 that transmits a storage request response to the requesting device. The storage request response includes information regarding execution of the storage request. For example, the storage request response may indicate successful execution of the storage request or other status information. In another embodiment, the storage request response includes information indicating where the data and associated source parameters were stored. This embodiment may not be desirable if the apparatus 300 is emulating a random access device. In one embodiment, the response transmission module 304 sends the storage request response after the storage response receiver module 302 receives the storage command responses indicating that all of the data of the data segment and associated source parameters were successfully stored on the data storage device 106. In another embodiment, the response transmission module 304 sends the storage request response independent of receiving a storage command response. One of skill in the art will appreciate other information sent in a storage request response and timing of sending the response.

In one embodiment, the apparatus 300 includes a compression module 306 that compresses data of an append data storage command to form the data prior to storage on the data storage device 106. Typically, the compression module 306 changes the data length of a portion data (or a data packet) of the data segment. This affects where data is stored and subsequent append points. In this case, each append point may be unknown until after compression. Where compression is used, the data storage device 106 or some module down steam of the compression module 306 typically tracks append points and physical location of data on the data storage device 106 and waits until data is compressed to determine data length of a portion of data (or a data packet) and a subsequent append point. Once an append point is known and the data is compressed, a location, which may be in the form of a physical address, along with data length can be reported back to the mapping module 206. In one embodiment, the compression module 306 stores compression information with the compressed data, typically in a data packet header for the data. One of skill in the art will recognize other features and consequences of compressing data prior to storage on the data storage device 106.

In another embodiment, the apparatus 300 includes an index rebuild module 308 that rebuilds the mapping created by the mapping module 206 for the data segment using one or more of the source parameters and the physical location on the data storage device 106 of the data of the data segment. To improve speed of access, the index is typically stored in faster, volatile memory such as DRAM that is subject to loss due to power failures, system resets, etc. Storing the source parameters with the data in a sequential storage device creates a non-volatile, data record within a sequential log that the index rebuild module 308 uses to re-create index mappings between source parameters and a physical address and data length.

Source parameters may be stored in a header, in a specific location within a data packet, or at the end of the data packet. Typically, the source parameters are stored in a header for the data packet. The data length is typically stored in a data header so that if an index or mapping is unavailable, data can be searched sequentially. In one embodiment, the index rebuild module 308 tracks through a region of the data storage device 106, such as a page or erase block, to rebuild an index that includes the mapping for the data segment.

Beneficially, physical locations of the data stored on the data storage device 106 along with the source parameters stored with the data comprise the primary virtual-to-physical map. The mapping created by the mapping module 206 comprises a secondary virtual-to-physical map. The secondary virtual-to-physical map is typically stored in RAM so that if power is lost, a failure occurs, or for some other reason the map created by the mapping module 206 becomes invalid, the primary virtual-to-physical map may be used to recreate the secondary virtual-to-physical map.

For example, the index rebuild module 308 looks at a data header at the start of a page of data in the data storage device 106. The index rebuild module 308 reads the physical address of the first data packet then reads the source parameters, including data length, in the header. The index rebuild module 308 then maps the source parameters in the data packet to the physical address and data length of the data packet. The index rebuild module 308 then uses the data length to move to the next data packet. The index rebuild module 308 then repeats the rebuild process tracking through all data packets in the page to build the secondary virtual-to-physical map. In this way, the data storage device 106 is a sequential log that can be used to rebuild an index containing mappings between physical addresses and source parameters, such as a virtual identifier, offset, logical block address, source physical length, etc.

In one embodiment, the index is periodically checkpointed, or stored in non-volatile memory at a particular point in time or in a particular state. An order of when each page was filled with data is maintained in-band and the order is correlated with checkpoints. If an index becomes unavailable, the most recent index corresponding to the latest checkpoint can be retrieved. The index may then be brought current by replaying the log starting at a location where a data packet was saved just after the checkpoint. The index rebuild module 308 may be synchronized by sequentially tracking through the data packets from the data packet stored after the checkpoint to the latest stored data packet in order to update the index to a current status. Beneficially, the index rebuild module 308 allows a checkpointed index to be restored efficiently and quickly.

In one embodiment, the apparatus 300 includes a command reordering module 310 that modifies a sequence that two or more outstanding append data storage commands are executed. The command reordering module 310 is beneficial to sequence commands in a more efficient way. In one embodiment, a read command might be postponed until a write command for the same data segment completes. In another embodiment, a storage device 102 that supports multiple channels may allow commands destined for a first channel to be postponed while that channel is busy and allow other commands to other channels to continue until such time as the first channel is available. In another embodiment, when the storage request receiver module 202 receives two or more storage requests, the apparatus 300 includes a request reordering module 312 that reorders a sequence that the storage requests are serviced. The command reordering module 310 and the request reordering module 312 are beneficial to sequence commands and requests in a more efficient way.

In another embodiment, the apparatus 300 includes a garbage collection module 314 that moves valid data from a storage region on the data storage device 106 identified for recovery and that erases invalid data from the storage region prior to returning the storage region to a pool of available space within the data storage device 106 for subsequent data storage. In this embodiment, the mapping module 206 updates the mapping of the source parameters of the valid data to one or more locations in the data storage device 106 to the new location where the data storage device 106 appended the valid data and associated source parameters. In one embodiment, moving valid data from a region selected for recovery may be treated in the same way as other storage requests.

Figure 4:
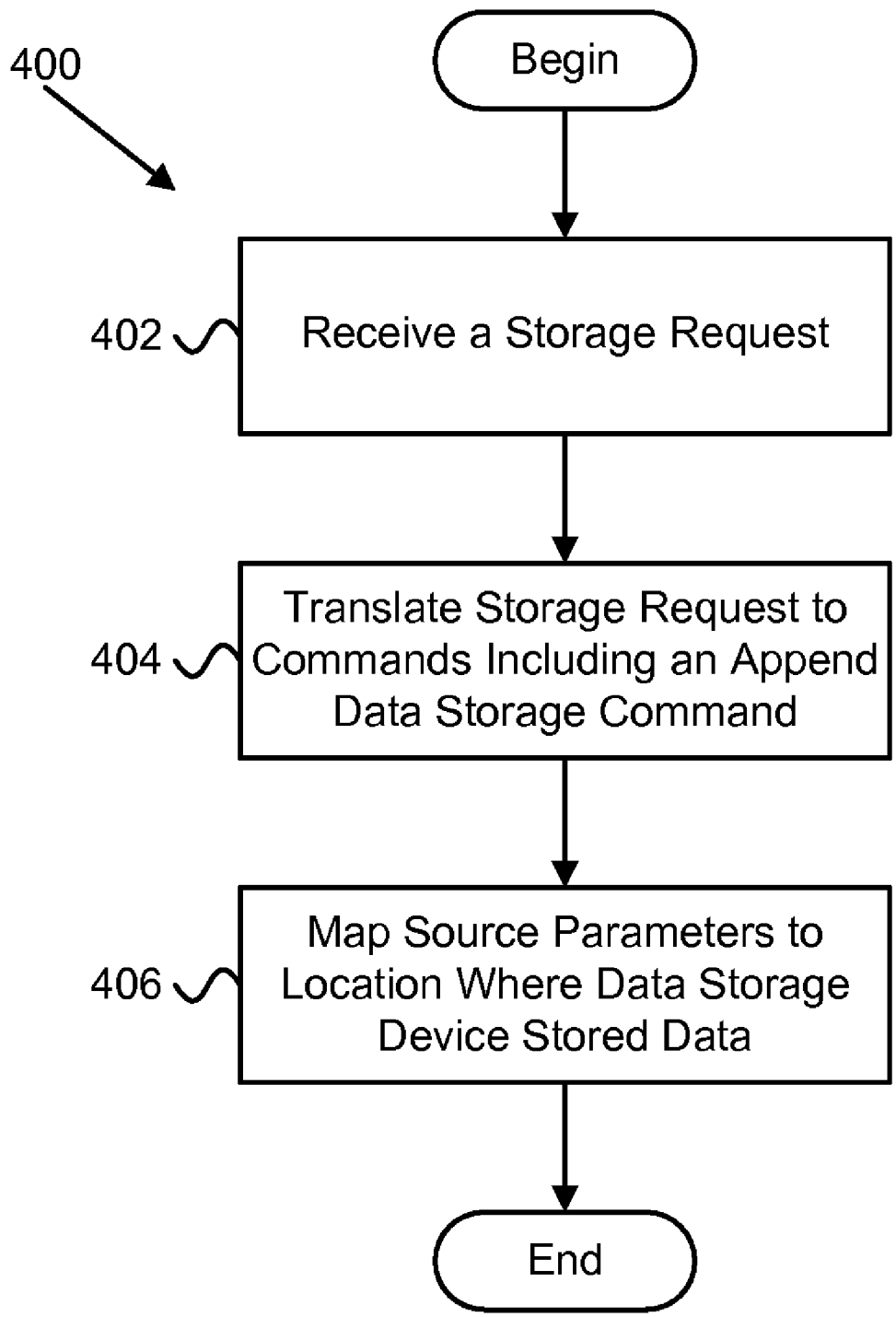
FIG. 4 is a schematic flow chart diagram illustrating one embodiment of a method for converting a storage request to an append data command in accordance with the present invention.

FIG. 4 is a schematic flow chart diagram illustrating one embodiment of a method 400 for converting a storage request to an append data command in accordance with the present invention. The method 400 begins and the storage request receiver module 202 receives 402 a storage request from a requesting device, such as a client 110 or a server 108. The storage request includes a request to store a data segment of a file or object onto the data storage device 106. The storage request may include one or more source parameters for the data segment that at least include one or more logical block addresses where the data segment is requested to be stored by the storage request and one or more data lengths corresponding to the one or more logical block addresses.

The translation module 204 translates 404 the storage request to one or more storage commands. At least one of the storage commands is an append data storage command. Each append data storage command directs the data storage device 106 to store data of the data segment at one or more append points. An append point is a location in the data storage device 106 that is a next address after the latest data segment that was stored on the data storage device 106. If the translation module 204 breaks the data segment into more than one segment, typically more than one data append command is created. This may be required if data resulting from the data segment will not fit at the end of a page, erase block, etc. at the append point. A second append point may be set at the beginning of another page, erase block, etc.

The mapping module 206 maps 406 one or more source parameters of the data segment to one or more locations in the data storage device 106 where the data storage device 106 appended the data of the data segment and the method 400 ends. Typically the mapping is part of an index that allows future access to the data. By mapping the physical locations of the data and data lengths to source parameters, the apparatus 200 can emulate a random access device while storing the data sequentially on the data storage device 106.

Figure 5:
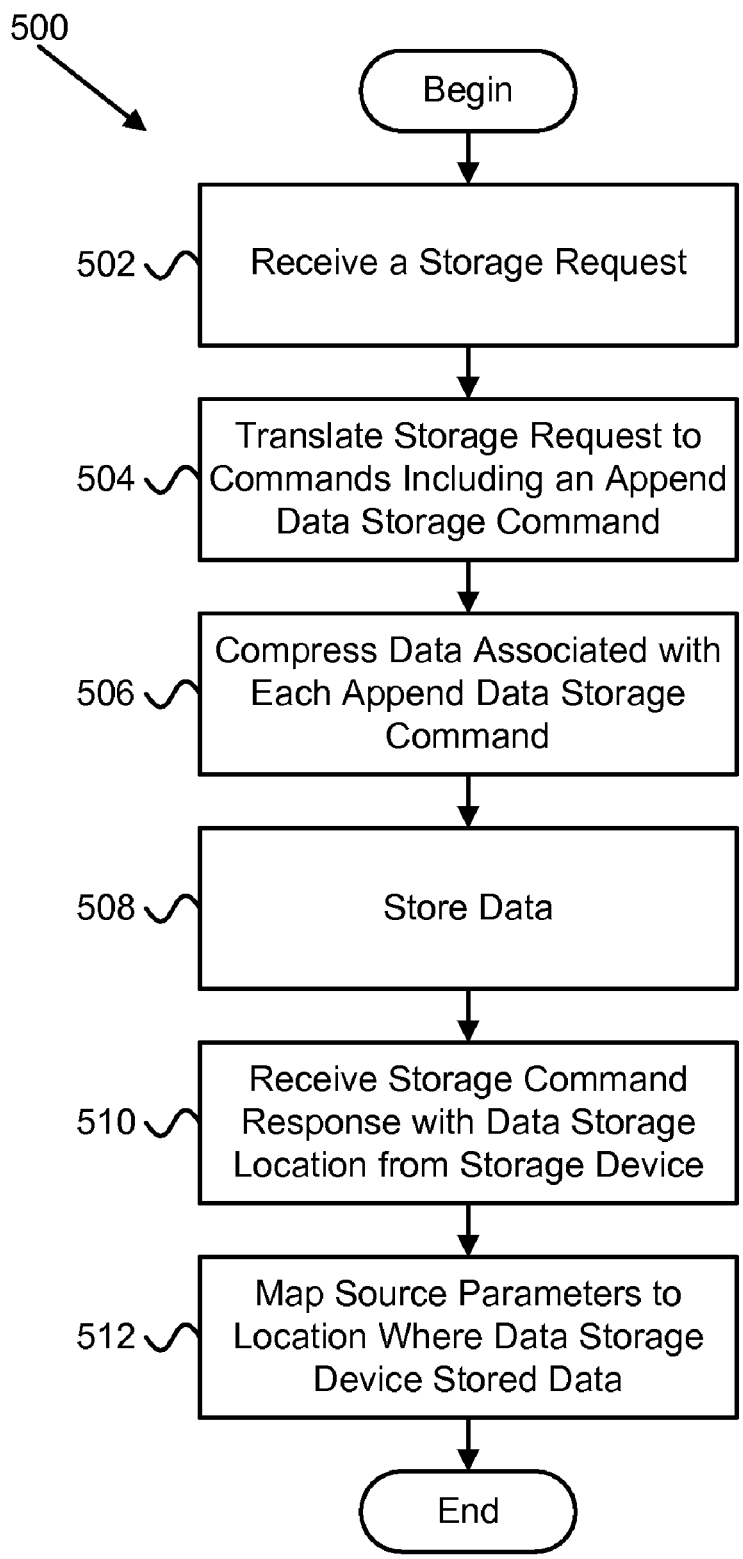
FIG. 5 is a schematic flow chart diagram illustrating one embodiment of another method for converting a storage request to an append data command in accordance with the present invention.

FIG. 5 is a schematic flow chart diagram illustrating one embodiment of another method 500 for converting a storage request to an append data command in accordance with the present invention. The method 500 begins and the storage request receiver module 202 receives 502 a storage request from a requesting device, such as a client 110 or a server 108. The translation module 204 translates 504 the storage request to one or more storage commands where at least one of the storage commands is an append data storage command. Again, each append data storage command directs the data storage device 106 to store data of the data segment at one or more append points.

The compression module 306 compresses 506 data of the one or more append data storage commands related to the data segments into compressed data and the data storage device 106 stores 508 the compressed data in response to the append data storage commands. The storage response receiver module 302 receives 510 one or more storage command responses from the data storage device 106. The storage command responses include one or more locations where the data storage device 106 appended the data of the data segment. Based on the storage locations received as part of the storage command responses, the mapping module 206 maps 512 one or more source parameters of the data segment to the one or more locations in the data storage device 106 where the data storage device 106 appended the data of the data segment and the method 500 ends. Compressing the data typically necessitates mapping the source parameters to the storage locations after the data is stored because compression typically changes the data length of the data.

Figure 6:
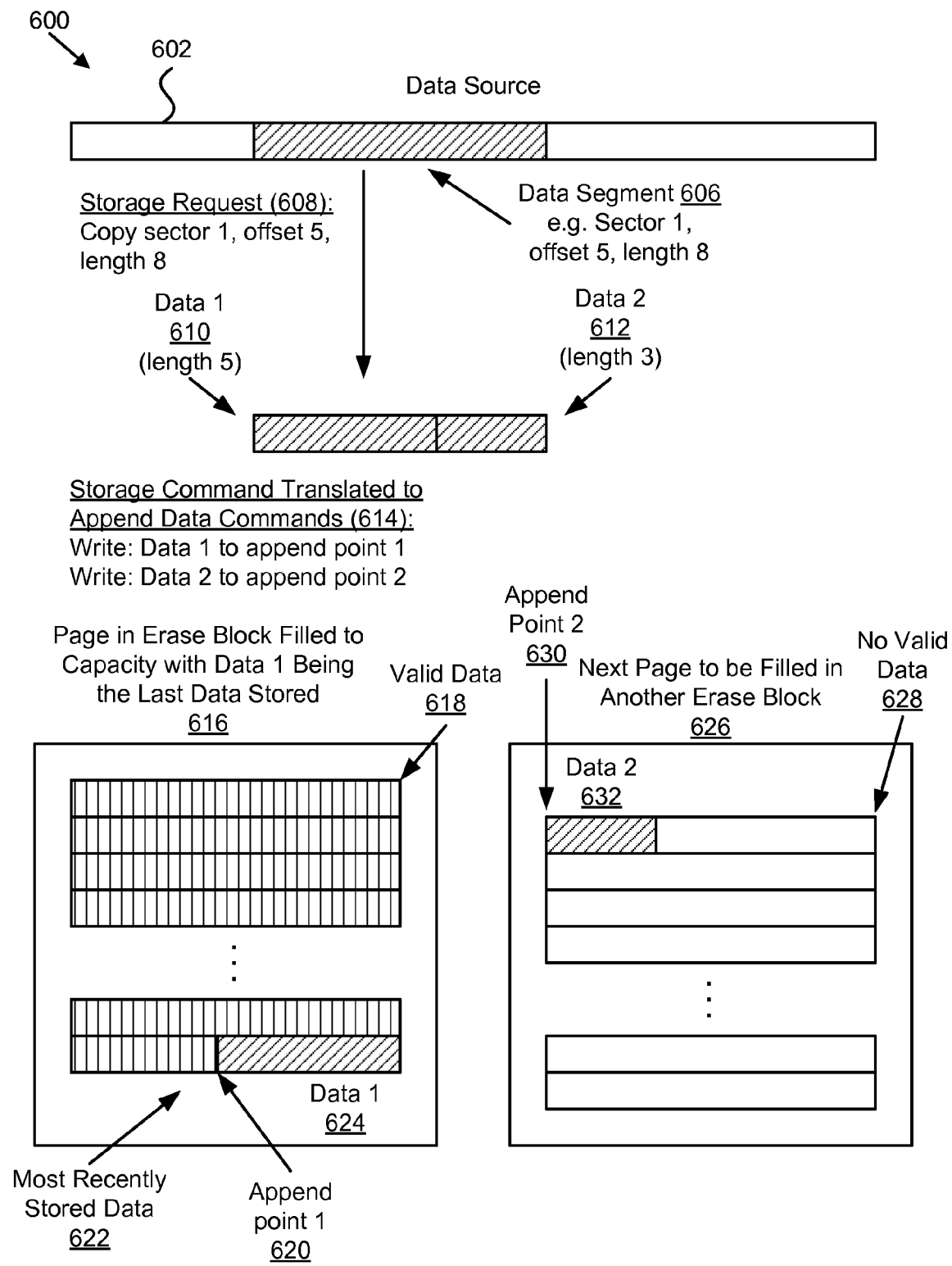
FIG. 6 is a schematic block diagram of an example of converting a storage request to an append data command in accordance with the present invention.

FIG. 6 is a schematic block diagram of an example 600 of converting a storage request to an append data command in accordance with the present invention. The example 600 is merely an illustration of one embodiment of an apparatus 200, 300 for converting a storage request to an append data storage command and is not intended to be limiting in any way. One of skill in the art will recognize that there are many ways to implement the present invention that are different than the example 600 of FIG. 6.

The example 600 may represent a logical block storage request where the requesting device directs the storage device 102 to store a data segment at a particular physical address. The requesting device, such as a client 110 or server 108, initiates a storage request to write data from a source data storage device. A portion of data 602 from the source data storage device is depicted along with a data segment 606 stored in the portion of data 602. In this case, the data segment 606 is intended to be stored on the storage device 102 at a physical address of sector 1, offset 5 and a data length of 8. In one embodiment, the requesting device formulates a storage request 608 that includes a header with source parameters, including a logical block address and data length, and transmits the storage request 608 to the storage device 102.

For simplicity, this example 600 assumes that data of the data segment 606 is not compressed. In this example 600, the data length of the data segment 606 is 8 and there is room for a data packet in the current page 616 where data is being stored for a data packet of data length 5. In this instance, the translation module 204 determines that the data segment 606 will not fit at the end of a current page 616 where data is currently stored and creates two append data storage commands 614 from the data segment 606 to store two data packets, Data 1 610 and Data 2 612.

The page 616 where data is being currently stored includes valid data 618. In other pages may include valid and invalid data. One append data storage command 614 stores Data 1 610 at Append Point 1 620, which is just after a location where data was most recently stored 622. Data packet Data 1 610 is then stored at the end of the current page 616 as shown 624.

A second append data storage command 614 stores Data 2 612 in the next page 626 where data is to be stored. In one embodiment, the next page 626 is in a different erase block than the page 616 where Data 1 610 is stored. In this embodiment, data stored at Append Point 1 620 may flow to a next page without having to set a new append point at the beginning of the next page unless the next page 626 is in another erase block. In another embodiment, the next page 626 is a page adjacent to the page 616 where Data 1 610 is stored or is somehow logically a next page, but a new Append Point 2 630 is required at the beginning of the next page 626. One of skill in the art will recognize when a second append point 630 is required to continue storing data. The next page 626 contains no valid data 628, either because the next page 626 has been erased or a storage space recovery process has determined that there is no longer valid data in the next page 626. The second append data storage command 614 stores the data packet Data 2 612 at Append Point 2 630 as shown 632.

While this example 600 is indicative of a case where a data segment 606 is split because data packets 610, 612 created from the data segment 606 falls on a page 616 boundary, in other cases data of the data segment 606 maybe stored together, or may be split into three or more data packets. In other cases, the compression module 306 compresses data of the data segment 606 to form one or more data packets 610, 612.

Figure 7:
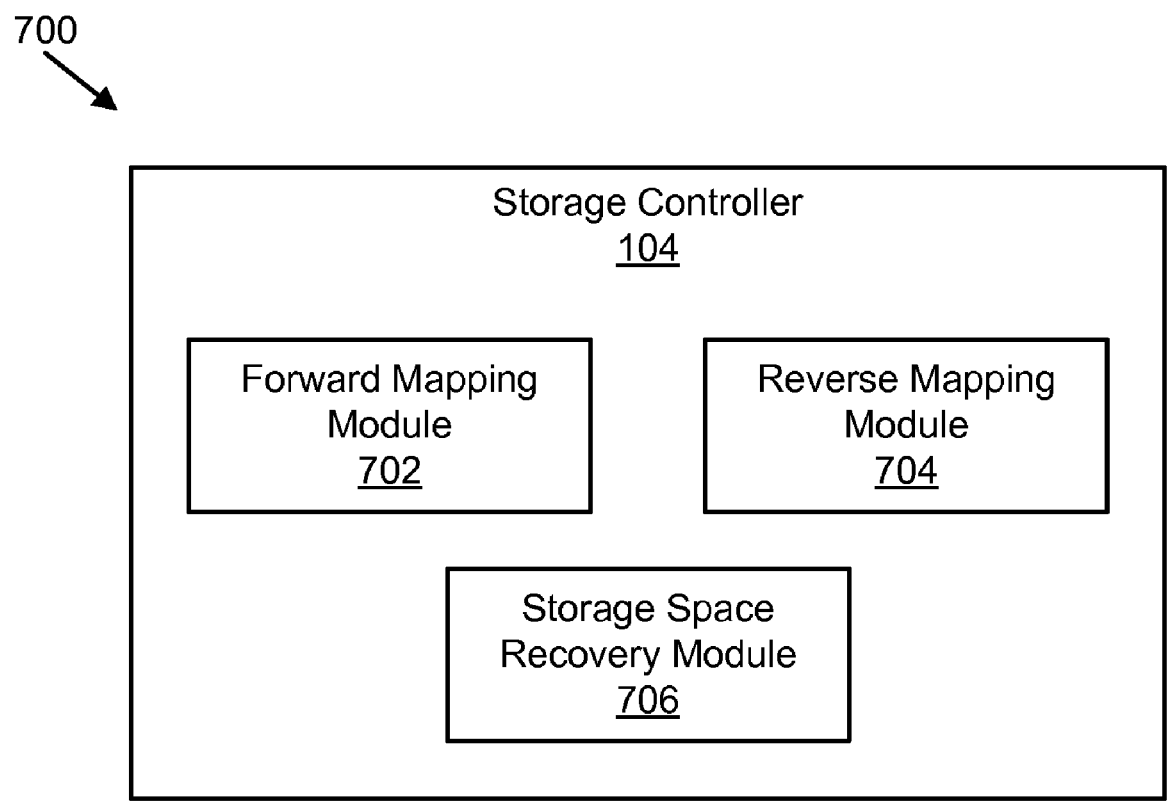
FIG. 7 is a schematic block diagram illustrating one embodiment of an apparatus for efficient mapping of virtual and physical addresses in accordance with the present invention.

FIG. 7 is a schematic block diagram illustrating one embodiment of an apparatus 700 to efficiently map physical and virtual addresses in accordance with the present invention. The apparatus 700 includes a forward mapping module 702, a reverse mapping module 704, and a storage space recovery module 706, which are described below. At least a portion of one or more of the forward mapping module 702, the reverse mapping module 704, and the storage space recovery module 706 is located within one or more of a requesting device that transmits the storage request, the data storage device 106, the storage controller 104, and a computing device separate from the requesting device, the data storage device 106, and the storage controller 104.

In one embodiment, the forward mapping module 702 and the reverse mapping module 704 work in conjunction with the mapping module 206. The forward mapping module 702 and the reverse mapping module 704 may be part of the mapping module 206 or may be separate and work together with the mapping module 206.

The apparatus 700 includes a forward mapping module 702 that uses a forward map to identify one or more physical addresses of data of a data segment. The physical addresses are identified from one or more virtual addresses of the data segment, which are identified in a storage request directed to the data storage device 106. For example, a storage request may include a request to read data stored in the data storage device 106. The storage request to read data includes a virtual address or virtual identifier associated with the data stored on the data storage device 106. The read request may include virtual address of a file from which the data segment originated, which may be interpreted that the read request is a request to read an entire data segment associated with the virtual address.

The read request, in another example, includes a virtual address along with an offset as well a data length of the data requested in the read request. For example, if a data segment is 20 blocks, a read request may include an offset of 16 blocks (i.e. start at block 16 of 20) and a data length of 5 so that the read request reads the last 5 blocks of the data segment. The read request may include an offset and data length also in a request to read an entire data segment or to read from the beginning of a data segment. Other requests may also be included in a storage request, such as a status request. Other types and other forms of storage requests are contemplated within the scope of the present invention and will be recognized by one of skill in the art.

The apparatus 700 includes a forward map that maps of one or more virtual addresses to one or more physical addresses of data stored in the data storage device 106. The virtual addresses correspond to one or more data segments relating to the data stored in the data storage device 106. The one or more virtual addresses typically include discrete addresses within a virtual address space where the virtual addresses sparsely populate the virtual address space. For a virtual address of a data segment, data length information may also be associated with the virtual address and may also be included in the forward map. The data length typically corresponds to the size of the data segment. Combining a virtual address and data length information associated with the virtual address may be used to facilitate reading a particular portion within a data segment.

Often virtual addresses used to identify stored data represent a very small number of virtual addresses that are possible within a name space or range of possible virtual addresses. Searching this sparsely populated space may be cumbersome. For this reason, the forward map is typically a data structure that facilitates quickly traversing the forward map to find a physical address based on a virtual address. For example, the forward map may include a B-tree, a content addressable memory ("CAM"), a binary tree, a hash table, or other data structure that facilitates quickly searching a sparsely populated space or range. By using a forward map that quickly searches a sparsely populated virtual namespace, the apparatus 700 provides an efficient way to determine one or more physical addresses from a virtual address.

While the forward map may be optimized, or at least designed, for quickly determining a physical address from a virtual address, typically the forward map is not optimized for locating all of the data within a specific region of the data storage device 106. For this reason, the apparatus 700 includes a reverse mapping module 704 that uses a reverse map to determine a virtual address of a data segment from a physical address. The reverse map is used to map the one or more physical addresses to one or more virtual addresses and can be used by the reverse mapping module 704 or other process to determine a virtual address from a physical address. The reverse map beneficially maps the data storage device 106 into erase regions such that a portion of the reverse map spans an erase region of the data storage device 106 erased together during a storage space recovery operation. The storage space recovery operation (or garbage collection operation) recovers erase regions for future storage of data. By organizing the reverse map by erase region, the storage space recovery module 706 can efficiently identify an erase region for storage space recovery and identify valid data. The storage space recovery module 706 is discussed in more detail below.

The physical addresses in the reverse map are associated or linked with the forward map so that if virtual address A is mapped to physical address B in the forward map, physical address B is mapped to virtual address A in the reverse map. In one embodiment, the forward map includes physical addresses that are linked to entries in the reverse map. In another embodiment, the forward map includes pointers to physical addresses in the reverse map or some other intermediate list, table, etc. One of skill in the art will recognize other ways to link physical addresses to the forward map and reverse map.

In one embodiment, the reverse map includes one or more source parameters. The source parameters are typically received in conjunction with a storage request and include at least one or more virtual addresses. The source parameters may also include data lengths associated with data of a data segment received in conjunction with a storage request. In another embodiment, the reverse map does not include source parameters in the form of virtual addresses or data lengths and the source are stored with data of the data segment stored on the data storage device 106. In this embodiment, the source parameters may be discovered from a physical address in the reverse map which leads to the source parameters stored with the data.

Storing the source parameters with the data is advantageous in a sequential storage device because the data stored in the data storage device 106 becomes a log that can be replayed to rebuild the forward and reverse maps. This is due to the fact that the data is stored in a sequence matching when storage requests are received, and thus the source data serves a dual role; rebuilding the forward and reverse maps and determining a virtual address from a physical address.

The apparatus 700 includes a storage space recovery module 706 that uses the reverse map to identify valid data in an erase region prior to an operation to recover the erase region. The identified valid data is moved to another erase region prior to the recovery operation. By organizing the reverse map by erase region, the storage space recovery module 706 can scan through a portion of the reverse map corresponding to an erase region to quickly identify valid data or to determine a quantity of valid data in the erase region. An erase region may include an erase block, a fixed number of pages, etc. erased together. The reverse map may be organized so that once the entries for a particular erase region are scanned, the contents of the erase region are known.

By organizing the reverse map by erase region, searching the contents of an erase region is more efficient than searching a B-tree, binary tree, or other similar structure used for virtual-to-physical address searches. Searching forward map in the form of a B-tree, binary tree, etc. is cumbersome because the B-tree, binary tree, etc. would frequently have to be searched in its entirety to identify all of the valid data of the erase region. The reverse may include a table, data base, or other structure that allows entries for data of an erase region to be stored together to facilitate operations on data of an erase region.

In one embodiment, the forward map and the reverse map are independent of a file structure, a name space, a directory, etc. that organize data for the requesting device transmitting the storage request, such as a file server or client operating in the server 108 or client 110. By maintaining the forward map and the reverse map separate from any file server of the requesting device, the apparatus 700 is able to emulate a random access, logical block storage device storing data as requested by the storage request.

Use of the forward map and reverse map allows the apparatus 700 to appear to be storing data in specific locations as directed by a storage request while actually storing data sequentially in the data storage device 106. Beneficially, the apparatus 700 overcomes problems that random access causes for solid-state storage, such as flash memory, by emulating logical block storage while actually storing data sequentially. The apparatus 700 also allows flexibility because one storage request may be a logical block storage request while a second storage request may be an object storage request, file storage request, etc. Maintaining independence from file structures, namespaces, etc. of the requesting device provides great flexibility as to which type of storage requests may be serviced by the apparatus 700.

Figure 8:
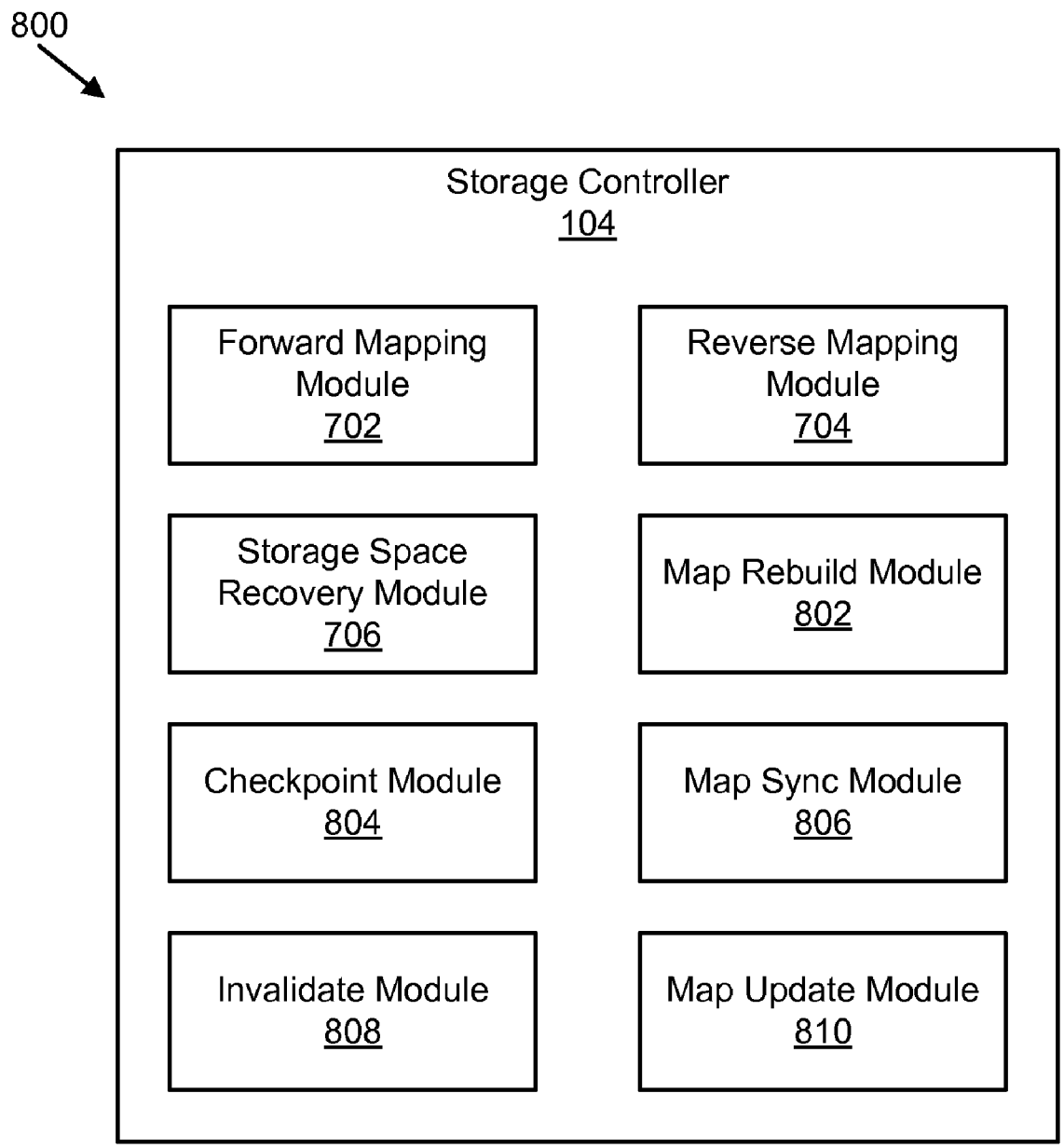
FIG. 8 is a schematic block diagram illustrating another embodiment of an apparatus for efficient mapping of virtual and physical addresses in accordance with the present invention.

FIG. 8 is a schematic block diagram illustrating another embodiment of an apparatus 800 for efficient mapping of virtual and physical addresses in accordance with the present invention. The apparatus 800 includes a forward mapping module 702, a reverse mapping module 704, and a storage space recovery module 706, which are substantially similar to those described above in relation to the apparatus 200 of FIG. 7. The apparatus 800 also includes a map rebuild module 802, a checkpoint module 804, a map sync module 806, an invalidate module 808, and a map update module 810, which are described below.

The apparatus 800 includes a map rebuild module 802 that rebuilds the forward map and the reverse map using the source parameters stored with the data. Where data is stored on the data storage device 106 sequentially, by keeping track of the order in which erase regions or erase blocks in the data storage device 106 were filled and by storing source parameters with the data, the data storage device 106 becomes a sequential log. The map rebuild module 802 replays the log by sequentially reading data packets stored on the data storage device 106. Each physical address and data packet length is paired with the source parameters found in each data packet to recreate the forward and reverse maps.

In another embodiment, the apparatus 800 includes a checkpoint module 804 that stores information related to the forward map and the reverse map where the checkpoint is related to a point in time or state of the data storage device. The stored information is sufficient to restore the forward map and the reverse map to a status related to the checkpoint. For example, the stored information may include storing the forward and reverse maps in non-volatile storage, such as on the data storage device, along with some identifier indicating a state or time checkpoint.

For example, a timestamp could be stored with the checkpoint information. The timestamp could then be correlated with a location in the data storage device 106 where data packets were currently being stored at the checkpoint. In another example, state information is stored with the checkpoint information, such as a location in the data storage device 106 where data is currently being stored. One of skill in the art will recognize other checkpoint information that may be stored by the checkpoint module 804 to restore the forward and reverse maps to the checkpoint.

In another embodiment, the apparatus 800 includes a map sync module 806 that updates the forward map and the reverse map from the status related to the checkpoint to a current status by sequentially applying source parameters and physical addresses. The source parameters applied are stored with data that was sequentially stored after the checkpoint. The physical addresses are derived from a location of the data on the data storage device 106.

Beneficially the map sync module 806 restores the forward and reverse maps to a current state from a checkpoint rather than starting from scratch and replaying the entire contents of the data storage device 106. The map sync module 806 uses the checkpoint to go to the data packet stored just after the checkpoint and then replays data packets from that point to a current state where data packets are currently being stored on the data storage device 106. The map sync module 806 typically takes less time to restore the forward and reverse maps than the map rebuild module 802.

In one embodiment, the forward and reverse maps are stored on the data storage device 106 and another set of forward and reverse maps are created to map the stored forward and reverse maps. For example, data packets may be stored on a first storage channel while the forward and reverse maps for the stored data packets may be stored as data on a second storage channel; the forward and reverse maps for the data on the second storage channel may be stored as data on a third storage channel, and so forth. This recursive process may continue as needed for additional forward and reverse maps. The storage channels may be on a single data storage device 106 or on separate data storage devices 106.

The apparatus 800 includes an invalidate module 808 that marks an entry for data in the reverse map indicating that data referenced by the entry is invalid in response to an operation resulting in the data being invalidated. The invalidate module 808 may mark an entry invalid as a result of a delete request, a read-modify-write request, and the like. The reverse map includes some type of invalid marker or tag that may be changed by the invalidate module 808 to indicate data associated with an entry in the reverse map is invalid. For example, the reverse map may include a bit that is set by the invalidate module 808 when data is invalid.

In one embodiment, the reverse map includes information for valid data and invalid data stored in the data storage device 106 and the forward includes information for valid data stored in the data storage device 106. Since the reverse map is useful for storage space recovery operations, information indicating which data in an erase block is invalid is included in the reverse map. By maintaining the information indicating invalid data in the reverse map, the forward map, in one embodiment, need only maintain information related to valid data stored on the data storage device 106, thus improving the efficiency and speed of forward lookup.

The storage space recovery module 706 may then use the invalid marker to determine a quantity of invalid data in an erase region by scanning the reverse map for the erase region to determine a quantity of invalid data in relation to a storage capacity of the erase region. The storage space recovery module 706 can then use the determined quantity of invalid data in the erase region to select an erase region for recovery. By scanning several erase regions, or even all available erase regions, the storage space recovery module 706 can use selection criteria, such as highest amount of invalid data in an erase region, to then select an erase region for recovery.

Once an erase region is selected for recovery, in one embodiment the storage space recovery module 706 may then write valid data from the selected erase region to a new location in the data storage device 106. The new location is typically within a page of an erase region where data is currently being stored sequentially. The storage space recovery module 706 may write the valid data using a data pipeline as described in U.S. patent application Ser. No. 11/952,091 entitled "Apparatus, System, and Method for Managing Data Using a Data Pipeline" for David Flynn et al. and filed Dec. 6, 2007, which is hereinafter incorporated by reference.

In one embodiment, the storage space recovery module 706 also updates the reverse map to indicate that the valid data written to the new location is invalid in the selected erase region and updates the forward and reverse maps based on the valid data written to the new location. In another embodiment, the storage space recovery module 706 coordinates with the map update module 810 (described below) to update the forward and reverse maps.

In a preferred embodiment, the storage space recovery module 706 operates autonomously with respect to data storage and retrieval associated with storage requests and other commands. Storage space recovery operations that may be incorporated in the storage space recovery module 706 are described in more detail in the Storage Space Recovery Application referenced above.

In one embodiment, the apparatus 800 includes a map update module 810 that updates the forward map and/or the reverse map in response to contents of the data storage device 106 being altered. In a further embodiment, the map update module 810 receives information linking a physical address of stored data to a virtual address from the data storage device based on a location where the data storage device stored the data. In the embodiment, the location where a data packet is stored may not be available until the data storage device 106 stores the data packet.

For example, where data from a data segment is compressed to form a data packet, the size of each data packet may be unknown until after compression. Where the data storage device 106 stores data sequentially, once a data packet is compressed and stored, an append point is set to a location after the stored data packet and a next data packet is stored. Once the append point is known, the data storage device 106 may then report back the physical address corresponding to the append point where the next data packet is stored. The map update module 810 uses the reported physical address and associated data length of the stored data packet to update the forward and reverse maps. One of skill in the art will recognize other embodiments of a map update module 810 to update the forward and reverse maps based on physical addresses and associated data lengths of data stored on the data storage device 106.

Figure 9:
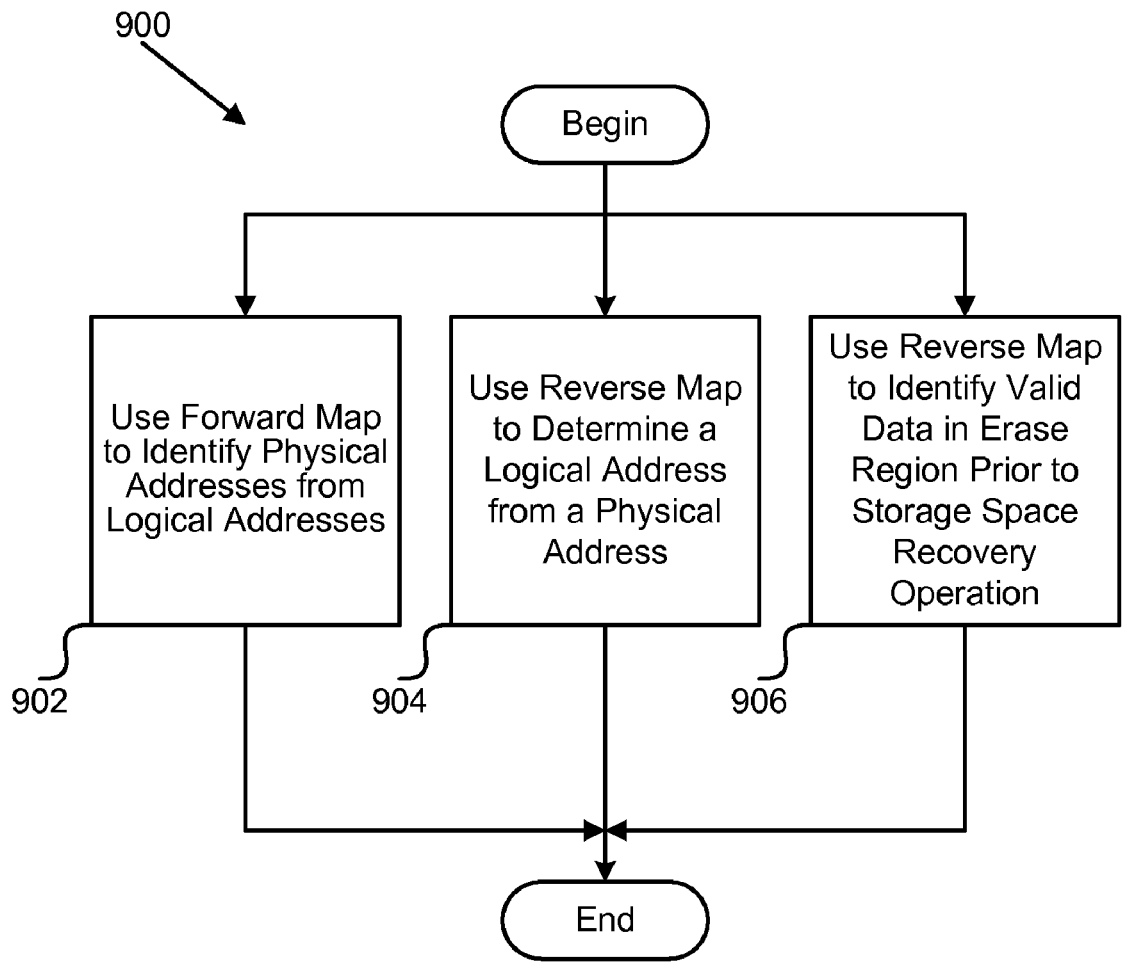
FIG. 9 is a schematic flow chart diagram illustrating one embodiment of a method for efficient mapping of virtual and physical addresses in accordance with the present invention.

FIG. 9 is a schematic flow chart diagram illustrating one embodiment of a method 900 for efficient mapping of virtual and physical addresses in accordance with the present invention. The method 900 begins and the forward mapping module 702 uses 902 the forward map to identify one or more physical addresses of data of a data segment. The physical addresses are identified from one or more virtual addresses of the data segment and the data segment is identified in a storage request directed to the data storage device 106. The forward map includes a mapping of one or more virtual addresses to one or more physical addresses of data stored in the data storage device 106. The virtual addresses are discrete addresses within a virtual address space where the virtual addresses sparsely populate the virtual address space.

The reverse mapping module 704 uses 904 the reverse map to determine a virtual address of a data segment from a physical address. The reverse map maps one or more physical addresses to one or more virtual addresses. The physical addresses in the reverse map are also associated with the forward map using pointers, links, etc. The virtual addresses in the reverse map correspond to one or more data segments relating to the data stored in the data storage device 106. The reverse map also maps the data storage device into erase regions such that a portion of the reverse map spans an erase region. An erase region of the data storage device 106 is erased together during a storage space recovery operation. The storage space recovery operation recovers erase regions for future storage of data.

The storage space recovery module 706 uses 906 the reverse map to identify valid data in an erase region prior to an operation to recover the erase region and the method 900 ends. The storage space recovery module 706 or other module associated with storage space recovery moves the identified valid data to another erase region prior to the recovery operation. Note that the steps 902, 904, 906 of the method 900 are shown in parallel because the steps 902, 904, 906 may be practiced independently in any order.

Figure 10:
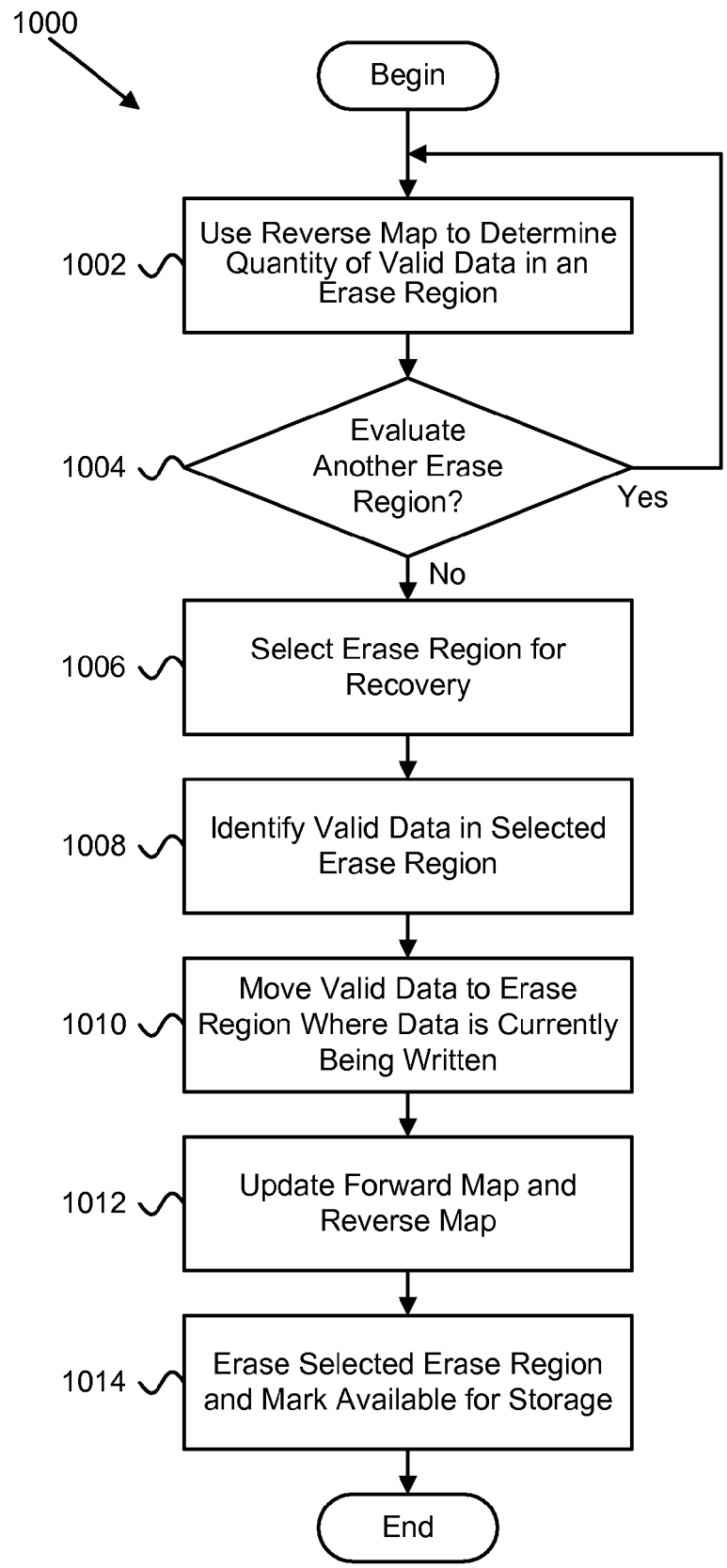
FIG. 10 is a schematic flow chart diagram illustrating another embodiment of a method for efficient mapping of virtual and physical addresses in accordance with the present invention.

FIG. 10 is a schematic flow chart diagram illustrating another embodiment of a method 1000 for efficient mapping of virtual and physical addresses in accordance with the present invention. The method 1000 begins and the storage space recovery module 706 determines 1002 a quantity of invalid data in an erase region by scanning the reverse map for the erase region to determine a quantity of invalid data in relation to a storage capacity of the erase region. The storage space recovery module 706 then determines 1004 if there is another erase region to evaluate. If the storage space recovery module 706 determines 1004 there is another erase region to evaluate, the storage space recovery module 706 determines a quantity of invalid data for the next erase region.

If the storage space recovery module 706 determines 1004 there is not another erase region to evaluate, the storage space recovery module 706 selects 1006 an erase region for recovery by using selection criteria, which may include using the quantity of invalid data in an erase region. The storage space recovery module 706 identifies 1008 valid data in the selected erase region and moves 1010 the valid data to an erase region where data is currently being written. The map update module 810 then updates 1012 the forward and reverse maps to reflect that the valid data has been written to another location in the data storage device 106.

In one embodiment, the storage space recovery module 706 erases 1014 the selected erase region and marks 1014 the selected storage region available for data storage and the method 1000 ends. In another embodiment, once the storage space recovery module 706 has written all valid data in the selected erase region to another location, the storage space recovery module 706 marks 1014 the selected storage region available for data storage without erasure.

Figure 11:
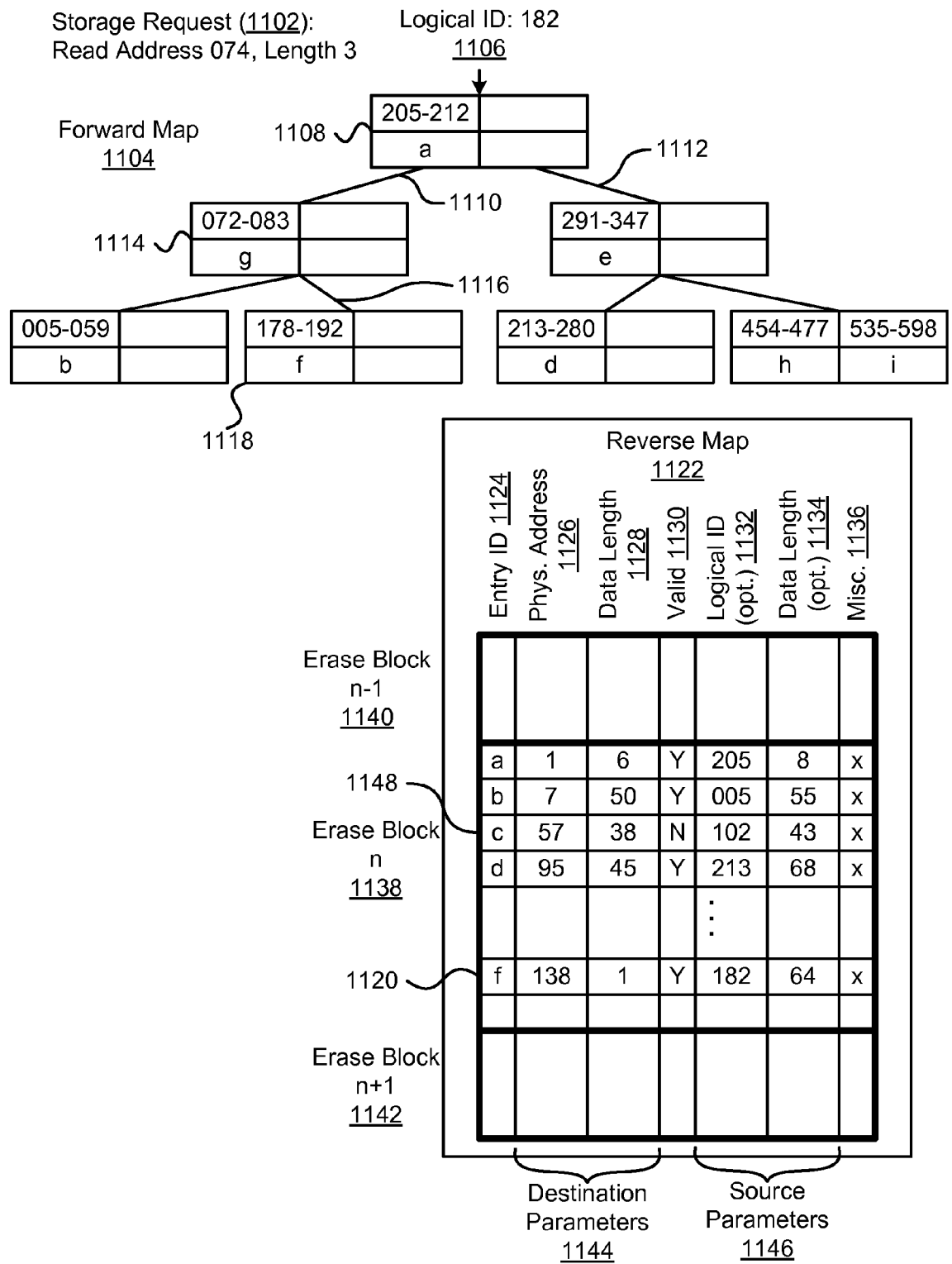
FIG. 11 is a schematic block diagram of an example of a forward map and a reverse map in accordance with the present invention.

FIG. 11 is a schematic block diagram of an example of a forward map and a reverse map in accordance with the present invention. Typically, the apparatus 700, 800 receives a storage request, such as storage request to read and address. For example, the apparatus 700, 800 may receive a logical block storage request 1102 to start reading read address 182 and read 3 blocks. Typically the forward map 1104 stores logical block addresses as virtual addresses along with other virtual addresses so the forward mapping module 702 uses forward map 1104 to identify a physical address from the virtual address 182 of the storage request 1102. In the example, for simplicity only virtual addresses that are numeric are shown, but one of skill in the art will recognize that any virtual address may be used and represented in the forward map 1104. A forward map 1104, in other embodiments, may include alpha-numerical characters, hexadecimal characters, and the like.

In the example, the forward map 1104 is a simple B-tree. In other embodiments, the forward map 1104 may be a content addressable memory ("CAM"), a binary tree, a hash table, or other data structure known to those of skill in the art. In the embodiment, a B-Tree includes nodes (e.g. the root node 1108) that may include two virtual addresses. Each virtual address may be a range. For example, a virtual address may be in the form of a virtual identifier with a range (e.g. offset and length) or may represent a range using a first and a last address or location.

Where a single virtual address is included at a particular node, such as the root node 1108, if a virtual address 1106 being searched is lower than the virtual address of the node, the search will continue down a directed edge 1110 to the left of the node 1108. If the searched virtual address 1106 matches the current node 1108 (i.e. is located within the range identified in the node), the search stops and the pointer, link, physical address, etc. at the current node 1108 is identified. If the searched virtual address 1106 is greater than the range of the current node 1108, the search continues down directed edge 1112 to the right of the current node 1108. Where a node includes two virtual addresses and a searched virtual address 1106 falls between the listed virtual addresses of the node, the search continues down a center directed edge (not shown) to nodes with virtual addresses that fall between the two virtual addresses of the current node 1108. A search continues down the B-tree until either locating a desired virtual address or determining that the searched virtual address 1106 does not exist in the B-tree.

In the example depicted in FIG. 11, the forward mapping module 702 searches for virtual address 182 1106 starting at the root node 1108. Since the searched virtual address 1106 is lower than the virtual address in the root node, 2005-212, the forward mapping module 702 searches down the directed edge 1110 to the left to the next node 1114. The searched virtual address 182 1106 more than the virtual address (072-083) stored in the next node 1114 so the forward mapping module 702 searches down a directed edge 1116 to the right of the node 1114 to the next node 1118. In this example, the next node 1118 includes a virtual address of 178-192 so that the searched virtual address 182 1106 matches the virtual address 178-192 of this node 1118 because the searched virtual address 182 1106 falls within the range 178-192 of the node 1118.

Once the forward mapping module 702 determines a match in the forward map 1104, the forward mapping module 702 returns a physical address, either found within the node 1118 or linked to the node 1118. In the depicted example, the node 1118 identified by the forward mapping module 702 as containing the searched virtual address 1106 includes a link "f" that maps to an entry 1120 in the reverse map 1122.

In the depicted embodiment, for each entry 1120 in the reverse map 1122 (depicted as a row in a table), the reverse map 1122 includes an entry ID 1124, a physical address 1126, a data length 1128 associated with the data stored at the physical address 1126 on the data storage device 106 (in this case the data is compressed), a valid tag 1130, a virtual address 1132 (optional), a data length 1134 (optional) associated with the virtual address 1132, and other miscellaneous data 1136. The reverse map 1122 is organized into erase blocks (erase regions). In this example, the entry 1120 that corresponds to the selected node 1118 is located in erase block n 1138. Erase block n 1138 is preceded by erase block n−1 1140 and followed by erase block n+1 1142 (the contents of erase blocks n−1 and n+1 are not shown). An erase block may be some erase region that includes a predetermined number of pages. An erase region is an area in the data storage device 106 erased together in a storage recovery operation, While the entry ID 1124 is shown as being part of the reverse map 1122, the entry ID 1124 may be an address, a virtual link, or other means to tie an entry in the reverse map 1122 to a node in the forward map 1104. The physical address 1126 is an address in the data storage device 106 where data that corresponds to the searched virtual address 1106 resides. The data length 1128 associated with the physical address 1126 identifies a length of the data packet stored at the physical address 1126. (Together the physical address 1126 and data length 1128 may be called destination parameters 1144 and the virtual address 1132 and associated data length 1134 may be called source parameters 1146 for convenience.) In the example, the data length 1120 of the destination parameters 1144 is different from the data length 1134 of the source parameters 1146 in one embodiment compression the data packet stored on the data storage device 106 was compressed prior to storage. For the data associated with the entry 1120, the data was highly compressible and was compressed from 64 blocks to 1 block.

The valid tag 1130 indicates if the data mapped to the entry 1120 is valid or not. In this case, the data associated with the entry 1120 is valid and is depicted in FIG. 11 as a "Y" in the row of the entry 1120. Typically the reverse map 1122 tracks both valid and invalid data and the forward map 1104 tracks valid data. In the example, entry "c" 1148 indicates that data associated with the entry 1148 is invalid. Note that the forward map 1104 does not include virtual addresses. The reverse map 1122 typically maintains entries for invalid data so that valid and invalid data can be quickly distinguished during a storage recovery operation.

The depicted reverse map 1122 includes source parameters 1146 for convenience, but the reverse map 1122 may or may not include the source parameters 1146. For example, if the source parameters 1146 are stored with the data, possibly in a header of the stored data, the reverse map 1122 could identify a virtual address indirectly by including a physical address 1126 associated with the data and the source parameters 1146 could be identified from the stored data. One of skill in the art will recognize when storing source parameters 1146 in a reverse map 1122 would be beneficial.

The reverse map 1122 may also include other miscellaneous data 1136, such as a file name, object name, source data, etc. One of skill in the art will recognize other information useful in a reverse map 1122. While physical addresses 1126 are depicted in the reverse map 1122, in other embodiments, physical addresses 1126, or other destination parameters 1144, may be included in other locations, such as in the forward map 1104, an intermediate table or data structure, etc.

Typically, the reverse map 1122 is arranged by erase block or erase region so that traversing a section of the map associated with an erase block (e.g. erase block n 1138) allows the storage space recovery module 706 to identify valid data in the erase block 1138 and to quantify an amount of valid data, or conversely invalid data, in the erase block 1138. Arranging an index into a forward map 1104 that can be quickly searched to identify a physical address 1126 from a virtual address 1106 and a reverse map 1122 that can be quickly searched to identify valid data and quantity of valid data in an erase block 1138 is beneficial because the index may be optimized for searches and storage recovery operations. One of skill in the art will recognize other benefits of an index with a forward map 1104 and a reverse map 1122.

Figure 12:
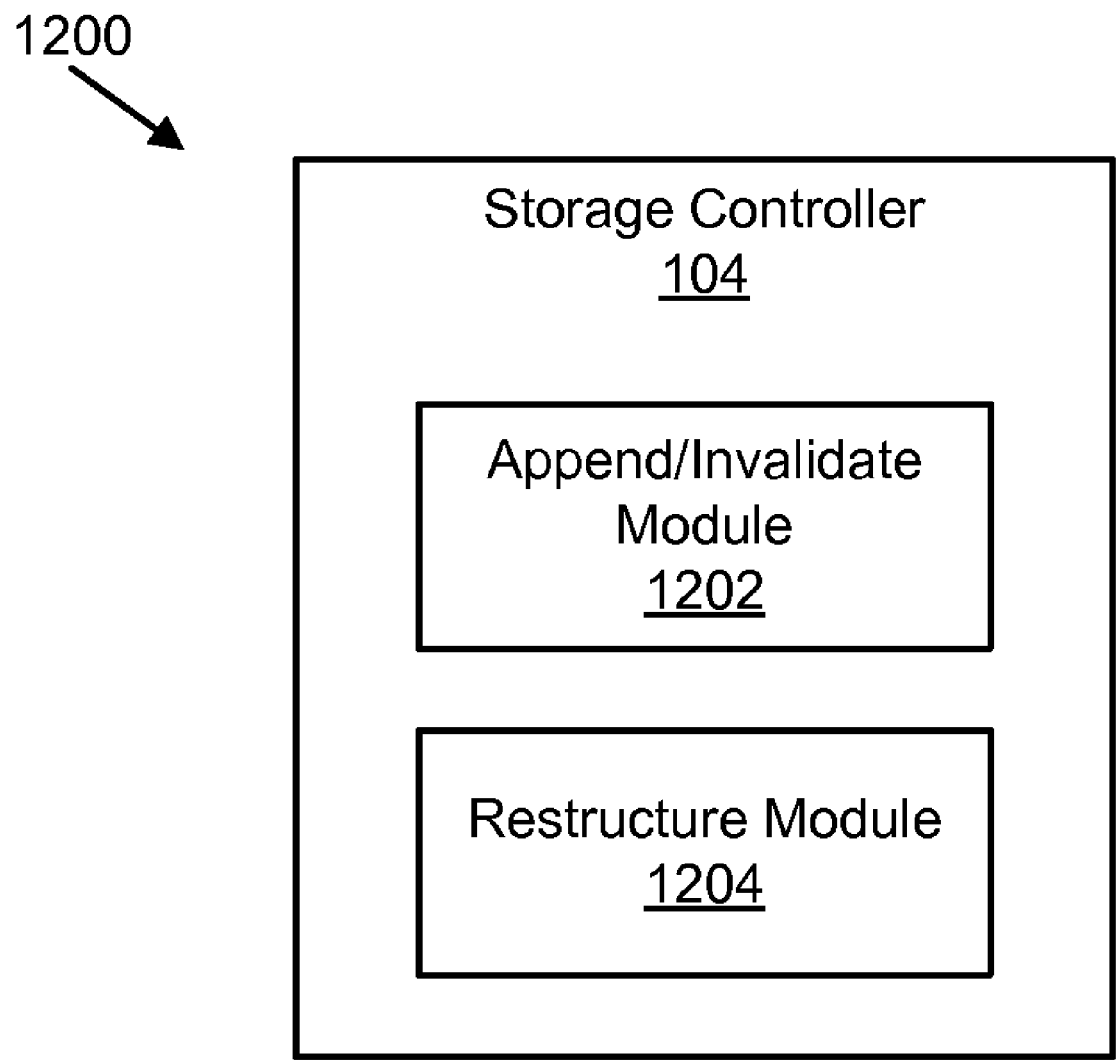
FIG. 12 is a schematic block diagram illustrating one embodiment of an apparatus for coordinating storage requests in accordance with the present invention.

FIG. 12 is a schematic block diagram illustrating one embodiment of an apparatus 1200 for coordinating storage requests in accordance with the present invention. The apparatus 1200 includes a storage controller 104 with an append/invalidate module 1202 and a restructure module 1204, which are described below. At least a portion of one or more of the append/invalidate module 1202 and the restructure module 1204 is located within one or more of a requesting device that transmits the storage request, the data storage device 106, the storage controller 104, and a computing device separate from the requesting device, the data storage device 106, and the storage controller 104.

The apparatus 1200 includes an append/invalidate module 1202 that generates a first append data storage command in response to receiving a first storage request and that generates a second append data storage command in response to receiving a second storage request. The first and second storage requests are received from one or more requesting devices. A requesting device may be the server 108 or a client 110 on the server 108 or in communication with the server 108 over a computer network 112.

The first storage request includes a request to overwrite existing data of a data segment with first data. The data segment is stored on a data storage device 106. The second storage request includes a request to overwrite existing data of the same data segment with second data. The first and second data include at least a portion of overlapping data to be stored at a common offset within the data segment and the second storage request is received after the first storage request.

The append/invalidate module 1202 also updates an index in response to the first storage request by marking data of the data segment invalid. The data that is marked invalid is data being replaced by the first data. The append/invalidate module 1202 also updates the index in response to the second storage request by marking data of the data segment invalid where the data marked invalid is data being replaced by the second data. In one embodiment, the append/invalidate module 1202 updates the index by updating a reverse map 1122. In one embodiment, the append/invalidate module 1202 updates the reverse map 1122 to indicate that the data segment is invalid. In another embodiment, the append/invalidate module 1202 marks only the data corresponding to the first data or to the second data invalid. This may require modifying the forward and reverse maps 1104, 1122 and is explained in detail below.

In another embodiment, marking data of the data segment as invalid may include generating a list indicating portions of the data segment being replaced by the first data and the second data are invalid and also indicating that portions of the data segment not being replaced are still valid. The list may be used by the restructure module 1204 in updating the index without marking the entire data segment invalid.

The apparatus 1200 includes a restructure module 1204 that updates the index based on the first data and updates the index based on the second data, where the updated index is organized to indicate that the second data is more current than the first data. This organization of the index is maintained when either the index is updated based on the first data before being updated based on the second data or the index is updated based on the second data before being updated based on the first data.

In one embodiment, organizing the index to indicate that for the overlapping data the second data is more current than the first data includes maintaining a pointer, link, etc. in the index for the overlapping data that corresponds to the second data regardless of the order of the update. For example, if the original data segment includes block 3 that is overwritten by the first data with 3' and by the second data with 3", the index points to 3" after the updates regardless of whether or not the index is updated with the second data before the first data or vice versa. Further explanation is provided below in the description of FIG. 16.

Organizing the index to indicate that the second data is more current than the first data may typically includes updating a portion of the index mapped to the overlapping data with the second data and retaining the mapping to the second data even in cases where the restructure module 1204 updates the index based on the second data before updating the index based on the first data.

While the append/invalidate module 1202 is updating the index, the append/invalidate module 1202 prevents access to index by another process or module to ensure data integrity. For example, if the append/invalidate module 1202 is updating the index based on the first data, the append/invalidate module 1202 prevents another instance of the append/invalidate module 1202 or the restructure module 1204 from updating the index based on the second data. By preventing access to the index (i.e. locking the index) while the index is updated, the apparatus 1200 supports multiple instances of the modules 1202, 1204 of the apparatus running on multiple processors or in multiple threads. Note that while two storage requests are discussed above, the present invention applies equally to situations where three or more storage requests are processed simultaneously.

Figure 13:
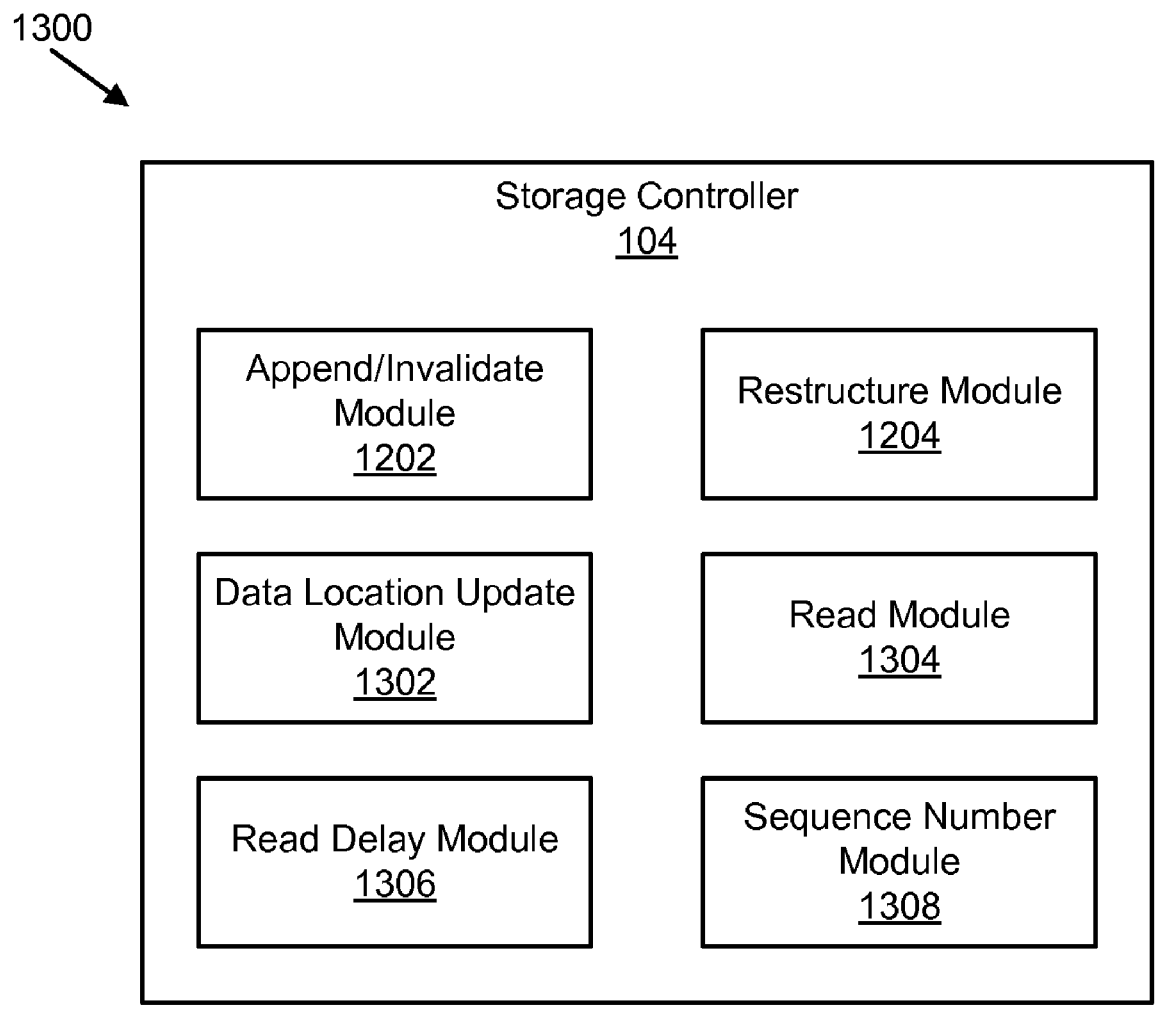
FIG. 13 is a schematic block diagram illustrating another embodiment of an apparatus for coordinating storage requests in accordance with the present invention.

FIG. 13 is a schematic block diagram illustrating another embodiment of an apparatus 1300 for coordinating storage requests in accordance with the present invention. The apparatus 1300 includes an append/invalidate module 1202 an a restructure module 1204 which are substantially similar to those described in relation to the apparatus 1200 of FIG. 12. The apparatus 1300 also includes a data location module 1302, a read module 1304, a read delay module 1306, and a sequence number module 1308, which are described below. The modules 1202, 1204, 1302-1308 of the apparatus 1300 are depicted in a storage controller 104, but all or a portion of the modules 1202, 1204, 1302-1308 may be included in the data storage device 106, client 110, server 108, or other device or location.

In one embodiment, the apparatus 1300 includes a data location module 1302 that updates the index with a first physical location where the data storage device 106 stored the first data and also updates the index with a second physical location where the data storage device 106 stored the second data. The apparatus 1300 receives the physical locations where the data storage device 106 stored the first data and the second data received from the data storage device 106. As discussed above, where the data storage device 106 stores data sequentially, the location where data is stored for a given data packet may not be known until a previous data packet is stored.

The updated index is organized to indicate that the second physical location is more current than the first physical location regardless of whether the index is updated based on the first physical location before being updated based on the second physical location or the index is updated based on the second physical location before being updated based on the first physical location. For example, if an overlapping portion of the first data is stored at Address 1 in response to the first storage request and an overlapping portion of the second data is stored at Address 2, the data location module 1302 stores Address 2 in the index for the portion of the index relating to the overlapping data. If the index is updated for the second data before updating for the first data, the index maintains Address 2 for the overlapping data rather than replacing Address 2 with Address 1.

The data location update module 1302 prevents access to the index by another instance of the data location module 1302 or another module, such as the append/invalidate module 1202 or the restructure module 1204, until the data location module 1302 has completed updating the index. Preventing access to the index while the data location module 1302 is updating the index provides increased data reliability.

Typically, processing of a particular storage request by the append/invalidate module 1202 precedes processing of the storage request by the restructure module 1204 and processing of the storage request by the restructure module 1204 precedes processing of the storage request by the data location module 1302. However, once the order of arrival of two storage requests has been determined, processing of a second storage request by an instance of the append/invalidate module 1202 may occur before processing of the first storage request by another instance of the append/invalidate module 1202. Likewise, processing of the second storage request by the restructure module 1204 may occur before processing of the first storage request by the append/invalidate module 1202 or by another instance of the restructure module 1204.

Similarly, processing of the second storage request by an instance of the data location module 1302 may occur before processing of the first storage request by the append/invalidate module 1202, the restructure module 1204, or another instance of the data location module 1302. This feature of the present invention allows asynchronous and independent multi-processor and/or multi-thread processing of storage requests. Preventing access to a module 1202, 1204, 1302 while another instance of the module 1202, 1204, 1302 is updating the index and organizing the index base on order of arrival rather than order of processing facilitates processing storage requests in parallel by multiple processors or threads.

The apparatus 1300 includes a reverse read module 1304 that reads at least a A portion of the data segment in response to a storage request that includes a read request. Read requests must be coordinated with storage requests that result in modification of a data segment so the apparatus 1300 also includes a read delay module 1306 that delays servicing the requested read until the first storage request is serviced by the append/invalidate module 1202, the restructure module 1204, and the data location update module 1302. The read delay module 1306 maintains data integrity by preventing a read while contents of a data segment are updated or while the index mapped to the data segment is updated.

In one embodiment, when a read request to read a data segment is received after a first storage request that overwrites at least a portion of the data segment but before a second storage request that also overwrites at least a portion of the data segment, the read delay module 1306 delays servicing the read request until both the first and second storage requests are serviced by the append/invalidate module 1202, the restructure module 1204, and the data location update module 1302. In this embodiment, the read delay module 1306 allows the data segment to be updated based on the second data storage request so that the read module 1304 will read the most current version of the data segment.

The apparatus 1300 includes, in one embodiment, a sequence number module 1308 that associates a sequence number with a storage request where the assigned sequence numbers represent an order that storage requests are received by the apparatus 1300. Sequence numbers facilitate organizing the index so that the index reflects that an update based on a second storage request takes precedent over an update based on a first storage request. In this embodiment, the restructure module 1204 organizes the index to indicate that the second data is more current than the first data by using a sequence number assigned to each of the first storage request and the second storage request. Likewise, the data location module 1302 also organizes the index to indicate that the second data is more current than the first data. The sequence number may be a time stamp, a number in a series, or any other mechanism that may be used to identify that one sequence number precedes another sequence number. One of skill in the art will recognize other forms of a sequence number.

In one embodiment, an instance append/invalidate module 1202, the restructure module 1204, or the data location module 1302 does not prevent access to the entire index while updating the index. The index may be divided into two or more regions. For example, one region may pertain to one area of the data storage device 106 and another region of the index may pertain to another area of the data storage device 106. In the embodiment, while a storage request pertaining to a first region of the index is serviced, additional instances of the append/invalidate module 1202, the restructure module 1204, or the data location module 1302 may service a second storage request pertaining to the second region. In another embodiment, the index may be divided to create multiple, virtual address regions that may be operated on independently. A region of the index may be a branch, a sub-branch, or even a node as long as restricting access to a region while the region is updated does not affect data integrity of other regions being updated simultaneously.

In one embodiment, the first and second storage requests are received with data that will replace at least a portion of the data segment. In another embodiment, one or both of the first and second storage requests are received substantially without data. In addition, corresponding append data storage requests may be transmitted to the data storage device 106 without data. For example, a storage request may not include data and may initiate either a direct memory access ("DMA") process or a remote DMA ("RDMA") process to transfer data of the data segment to the data storage device 106. Likewise, an append data storage command transmitted to the data storage device 106 may direct the data storage device 106 to set up a DMA or RDMA process to transfer data. The apparatus 1200, 1300 is flexible enough to handle one storage request with data, another that is part of a recovery process, and another that sets up a DMA or RDMA operation.

While the present invention discloses how instances of the append/invalidate module 1202, the restructure module 1204, and the data location update module 1302 handle requests received at about the same time and that affect a single data segment, one of skill in the art will recognize that the append/invalidate module 1202, the restructure module 1204, and the data location update module 1302 may handle a variety of other storage requests that affect different portions of a single data segment and also may handle storage requests affecting two or more separate data segments.

Figure 14:
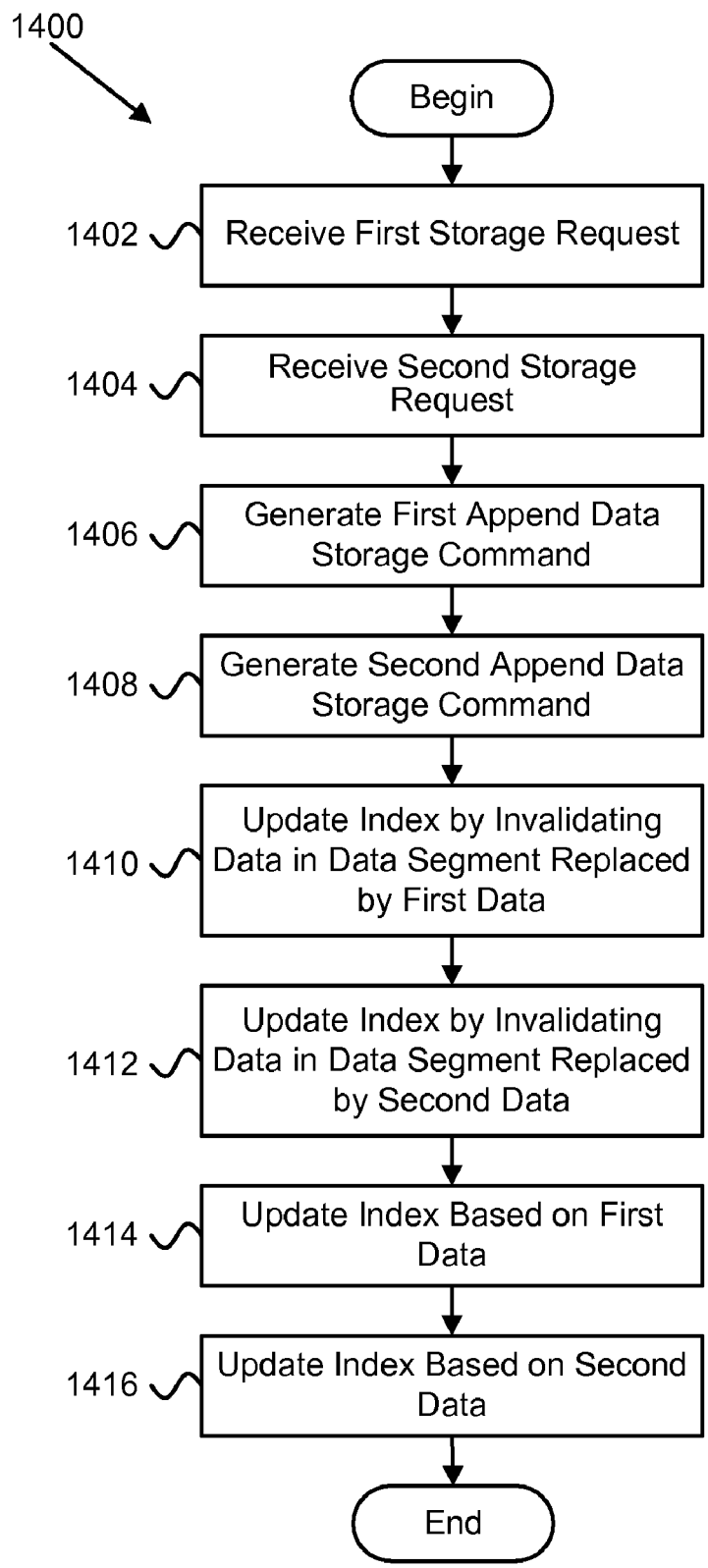
FIG. 14 is a schematic flow chart diagram illustrating one embodiment of a method for coordinating storage requests in accordance with the present invention.

FIG. 14 is a schematic flow chart diagram illustrating one embodiment of a method 1400 for coordinating storage requests in accordance with the present invention. The method 1400 begins and the apparatus 1200 receives 1402 a first storage request. The apparatus 1200 receives 1404 a second storage request. The first and second storage requests affect a single data segment by overwriting at least a portion of the data segment. In addition, the first and second data requests overwrite at least one overlapping portion of the data segment common to both the first and second storage requests.

An instance of the append/invalidate module 1202 generates 1406 a first append data storage command to overwrite at least a portion of the data segment with first data. An instance of the append/invalidate module 1202 also generates 1408 a second append data storage command to overwrite at least a portion of the data segment with second data. The instance of the append/invalidate module 1202 that is servicing the first data request also updates 1410 the index by invalidating data of the data segment replaced by the first data. The instance of the append/invalidate module 1202 that is servicing the second data request also updates 1412 the index by invalidating data of the data segment replaced by the second data.

An instance of the restructure module 1204 updates 1414 the index based on the first data. An instance of the restructure module 1204 also updates 1416 the index based on the second data and the method 1400 ends. While any instance of the append/invalidate module 1202 or the restructure module 1204 is updating the index, other instances of the modules 1202, 1204 are prevented from accessing the index.

The order of the steps 1406-1416 related to instances of the append/invalidate module 1202 and the restructure module 1204 are merely one embodiment. Other ordering of the steps 1406-1416 are possible and are an important feature of the present invention as long as the first storage request is serviced by the append/invalidate module 1202 before the first storage request is serviced by the restructure module 1204 and the second storage request is serviced by the append/invalidate module 1202 before the second storage request is serviced by the restructure module 1204. For example, an instance of the append/invalidate module 1202 and an instance of the restructure module 1204 may service the second storage request prior to another instance of the append/invalidate module 1202 services the first storage request. Possible ordering of servicing storage requests is discussed in more detail below with respect to the example depicted in FIG. 16.

Figure 15:
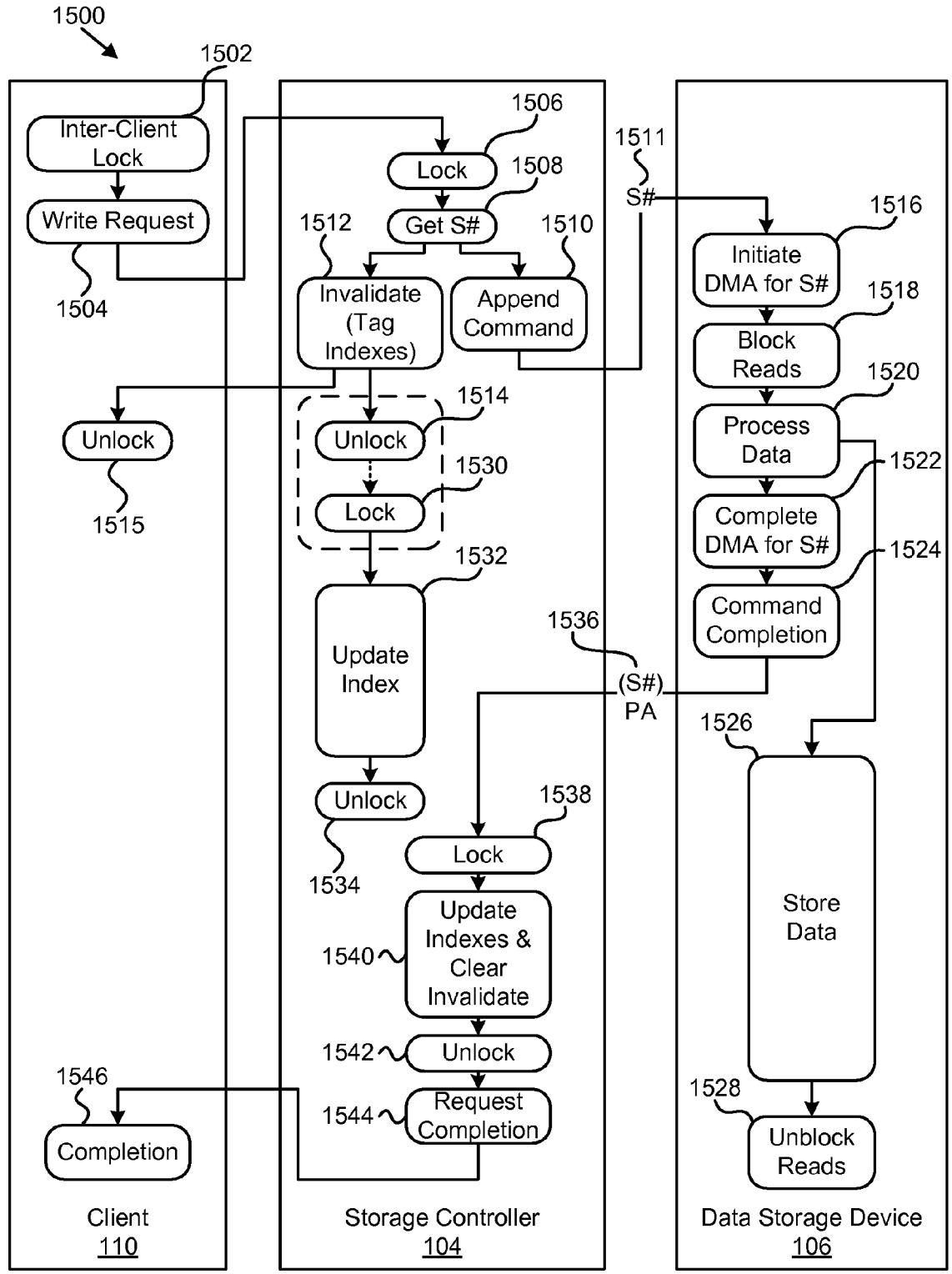
FIG. 15 is a schematic flow chart diagram illustrating another embodiment of a method for coordinating storage requests in accordance with the present invention.

FIG. 15 is a schematic flow chart diagram illustrating another embodiment of a method 1500 for coordinating storage requests in accordance with the present invention. The method 1500 is an example showing steps taken to coordinate storage requests in a client 110, storage controller 104 or other location of the apparatus 1200, 1300 described above, and in the data storage device 106. Note that while the method 1500 depicts action in three devices, the method 1500 is not intended to imply that the present invention is required to span more than one device, nor is it intended to imply that the modules must be located as shown in FIGS. 12 and 13.

The present invention may be practiced within the storage controller 104 or other single device in communication with the storage controller 104 of a data storage device 106 or may also include a portion of a driver within a client 110, server 108, etc. The actions depicted within the client 110 and data storage device 106 are typically independent of the present invention and are shown merely to illustrate what typically happens in the client 110 and data storage device 106 to transmit a storage request and to store data in response to the storage request.

While the method 1500 depicts a single client 110, multiple clients 110 typically are present and each access the data storage device 106 through one or more instances the storage controller 104. The method 1500 begins when the client 110 initiates 1502 an inter-client lock that coordinates writing data with the other clients 110 so that the client 110 shown is the only client 110 transmitting a storage request with a write request at a particular time. The write request is a request may be a request to write new data or to replace or modify an existing data segment. While preventing access to the index is while servicing a write request to write new data is important, the present invention is particularly useful when replacing or modifying an existing data segment to ensure data integrity in the presence of two or more requests to modify/replace the same data segment. In the embodiment, once the inter-client lock is in place to assure synchronization of write requests from more than one client 110, the client 110 transmits 1504 a write request to the storage controller 104. In another embodiment, no inter-client synchronization is utilized and storage requests have no predetermined order. In the depicted embodiment, the write request is substantially without data and initiates a DMA process to transfer data from the client 110 or other location to the data storage device 106.

The append/invalidate module 1202 then prevents multiple access to the index by "locking" 1506 the index. The sequence module 1308 then gets 1508 a sequence number and associates the sequence number with the write request. The append/invalidate module 1202 then creates 1510 an append data storage command based on the write request. The append data storage command includes the assigned sequence number and relates to data in the data segment that is requested to be overwritten by the write request. The append/invalidate module 1202 or other module in the storage controller 104 then transmits 1511 the append data storage command to the data storage device 106 with the sequence number 1511. The append data storage command includes a command to initiate a DMA process to transfer data from the client 110 or other location to the data storage device 106.

In addition, the append/invalidate module 1202 updates 1512 the index by marking existing data as invalid. The existing data is data that is part of the data segment and is to be replaced by the data referenced in the write request. The append/invalidate module 1202 then releases 1514 the lock on the index so that other write requests may be serviced. In addition, the client 110 unlocks 1515 transmitting write requests so that another client 110 can send a write request to the storage controller 104. In one embodiment, the append/invalidate module 1202 invalidates the entire data segment temporarily until the index is updated. After the index is updated, the portions of the data segment not affected by the write request are marked valid. In another embodiment, the append/invalidate module 1202 invalidates only the portion of the index associated with the data being overwritten.

Note that creating 1510 the append data storage command is shown in parallel to invalidating 1513 data. In another embodiment, the append/invalidate module 1202 creates 1510 the append data storage command after invalidating 1512 data and releasing 1514 the lock on the index. In the preferred embodiment, the data storage device 106 stores data packets in order of the sequence numbers. By associating the sequence number 1511 with the append data storage command, the append/invalidate module 1202 may, in one embodiment, create 1510 the append data storage command independent of invalidating 1512 data and unlocking 1512 the index.

Once the append command and sequence number are received by the data storage device 106, the data storage device 106 initiates 1516 a DMA process to transfer the data associated with the write request to the data storage device 106. The data storage device 106 also blocks 1518 reading of this data to be stored and processes 1520 the received data. Processing the data might include pre-pending headers, compressing the data, encrypting the data, creating error correcting code ("ECC"), etc. Processing may also include multiple DMA transfers, though only one is shown. The data storage device 106 then completes the DMA for the append data storage command associated with the sequence number and then completes 1524 the append data storage command.

In other embodiments, the append/invalidate module 1202 creates other commands associated with the write request in addition to the append data storage command and associates the commands with the sequence number. The storage controller 104 then transmits the commands with the sequence number attached to each command. The data storage device 106 then completes 1524 all commands associated with the sequence number. One of skill in the art will recognize other commands associated with a write request that may be generated to service the write request. Once the data storage device 106 processes 1520 the data received through the DMA, the data storage device 106 stores 1526 the data and unblocks 1528 reading the data. Note that storing 1526 the data is a process that may take longer than other processes. In the preferred embodiment, the storage controller 104 will process many other storage requests while the data is being stored.

After the append/invalidate module 1202 unlocks the 1514 the index, the restructure module 1204 locks 1530 the index and updates 1532 the index based on the data requested to be written with respect to the write request received from the client 110. The restructure module 1204 then unlocks 1534 the index. Once unlocked, the index can be accessed by other instances of the append/invalidate module 1202 and the restructure module 1204. In one embodiment, instead of the append/invalidate module 1202 unlocking 1514 the index and the restructure module 1204 re-locking 1530 the index, the index remains locked throughout the invalidate process of the append/invalidate module 1202 and the index update of the restructure module 1204.

Once the data storage device 106 completes 1524 the command(s) associated with a sequence number 1511, the data storage device 106 transmits 1536 one or more physical addresses where the data storage device 106 stored 1526 the associated data. In one embodiment, the command completion 1524 is transmitted with a sequence number 1536. In the preferred embodiment, the sequence number 1536 transmitted with the command completion 1524 is the same as sequence number 1511 as transmitted initially to the data storage device 106. The data location module 1302 locks 1538 the index and updates 1540 the index to point to the location(s) where the data storage device 106 stored 1526 the data. In the embodiment, the append/invalidate module 1202 clears the invalidate flag for the associated data segment. In another embodiment where the append/invalidate module 1202 invalidated the entire data segment associated with the write request, the data location module 1302 clears the invalidate flag on data that was not affected be the write request. The data location module 1302 then unlocks 1542 the index and the storage controller 104 completes 1544 the write request and sends a confirmation to the client 110. The client 110 then receives 1546 and processes the confirmation and the method 1500 ends.

In one embodiment, each time the index is locked 1506, 1530, 1538, the entire index is locked. In another embodiment, only a portion of the index is locked. For example, a branch may be locked or even a node corresponding to the data segment is locked.

FIG. 16 (which includes FIGS. 16A, 16B, and 16C) is a schematic block diagram illustrating an example 1600 of an apparatus 1200, 1300 for coordinating storage requests in accordance with the present invention. In the example. 1600, a data segment in an original state 1602 is assumed to be stored on the data storage device 106 based on a previous write request to store the data segment. Also in the example, the apparatus 1200, 1300 receives two storage requests from two clients 110: Client A sends Request 1 and Client B sends Request 2. Both storage requests seek to overwrite a portion of the data segment. Request 1 from Client A is received before Request 2 from Client B.

A sequence in time 1604 as requests are received is shown that represents how a client 110 would perceive changes to the data segment if the storage controller 104 emulates the data storage device 106 as a random access device. The original state 1602 of the data segment includes five blocks numbered 1-5. A block in the original state 1602 is shown with no cross hatching. Client A sends Request 1 associated with First Data that modifies blocks 2 and 3. The First Data 1606 shows the new data in blocks 2 and 3 as 2' and 3' respectively. A block with the First Data 1606 is shown with horizontal cross hatching. Client A sends Request 2 associated with Second Data that modifies blocks 3 and 4. The Second Data 1608 shows the new data in blocks 3 and 4 as 3" and 4" respectively. A block with the Second Data 1608 is shown with diagonal cross hatching running from top-left to bottom-right. A final state 1610 is shown where the First Data and Second Data overwrite blocks 2, 3, and 4.

Of particular note is that in the final state 1610, block 3 includes the Second Data 3". This is due to Request 2 arriving after Request 1. Since Request 2 is second in time to Request 1, Request 2 is considered to be more current than Request 1. The example 1600 depicts several scenarios for updating the index for the data segment such that the final state of the index is the same in each case and the Second Data is more current than the First Data.

In the example 1600, once a request is received it is processed in three steps. First, an instance of the append/invalidate module 1202 invalidates data in the data segment that will be replaced by data of the write request. Second, the index is assumed to have a forward map 1104 in the form of a B-tree, binary tree, or similar structure and an instance of the restructure module 1204 updates the index by restructuring the tree. Third, the data location module 1302 uses one or more locations of where the data storage device 106 stored the data to update the index. For example, the data location module 1302 may update a reverse map 1122. The three actions for Request A are shown as A1, A2, and A3. The three actions for Request B are shown as B1, B2, and B3. In another embodiment, steps A1 and A2 may be combined into a single step. Similarly, A2 and A3 could be combined. Rearranging and combining the steps or processes executed within the step are consistent with the broad scope of the invention.

The example 1600 depicts a state of the tree for 10 different sequences (S1-S10) of updating the tree based on various combinations of the actions associated with Request A and Request B. Note that the final state for all of the 10 possible sequences is the same, which is the desired result. The sequences S1-S10 all start with step A1. This assumes that the append/invalidate module 1202 assigns a sequence number and invalidates data for Request 1 from client A right after it was received. In another embodiment, assigning sequence numbers may be decoupled from invalidating data. In this embodiment, where Request 1 from client A is received before Request 2 from client B and one or more instances of the append/invalidate module 1202 initially assign a sequence number to each request based on order of arrival, since each request has an assigned sequence number, processing in step A1 to invalidated data may be delayed and B1 may be processed first to invalidate data. In this case, the final state of additional sequences where B1 precedes A1 (not shown) will be the same as shown in sequences S1-S10.

The first sequence S1 depicts an original state of a node in the tree representing blocks 1-5 of the data segment. (Note that the node representing the original state has no cross hatching to match the original state of the blocks shown above.) The node shows a range of 1-5 ("1:5") which corresponds to the blocks 1-5 being in an original state 1602. The first step of the sequence S1 is for the append/invalidate module 1202 to invalidate the node of the data segment. This is depicted at step A1 where the node is shown invalidated and an A below the node indicating that Request A is being serviced to invalidate the data. Invalidating the range is depicted with a cross hatch that runs from top-right to bottom-left and a letter under the node indicating which request invalidated the data.

Note that for simplicity, the entire range 1-5 is shown as invalidated in the sequences S1-S10 shown in the example 1600. However, in a preferred embodiment, only the blocks affected by a request are invalidated. During this invalidation process the append/invalidate module 1202 locks all or a portion of the index.

The second step of the sequence S1, shown as A2, is for the restructure module 1204 to restructure the tree to split out blocks 2 and 3, which will point to 2' and 3'. At this stage, the lock for blocks 1, 4, and 5 are released and the data remains accessible for reads in the original state. Blocks 2 and 3 are shown in the middle node of the tree as invalid. The third step of the sequence S1, shown as A3, is for the data location module 1302 to update the tree based on locations of the where the blocks 2' and 3' were stored on the data storage device 106. This is depicted as the middle node showing new blocks 2' and 3' and the node having a horizontal cross hatch corresponding to a final state of the blocks at the end of step A3 as shown in the completion of the client A update 1606 above. This may be accomplished by updating pointers in the node of the forward map 1104 to point to one or more entries in the reverse map 1122 where the entries in the reverse map 1122 have the physical addresses of the First Data. In this case, the reverse map 1122 has physical addresses for 2' and 3'.

The fourth step of the sequence S1, shown as B1, is for an instance of the append/invalidate module 1202 to invalidate nodes in the tree to be overwritten by the Second Data 3" and 4". In this case, the second node (2':3') and third node (4:5) are affected so both nodes are depicted as invalid (right to left cross hatching). The fifth step of the sequence S1, shown as B2, is for the restructure module 1204 to restructure the two nodes to form a node pointing to 2', a node pointing to 3":4", and a node pointing to block 5. The node pointing to 3":4" is shown as invalid.

The sixth step of the sequence S1, shown as B3, corresponds to an instance of the data location module 1302 updating the index with physical address information where the data storage device 106 stored blocks 3" and 4". At this point the node representing 3" and 4" is shown in a final state with cross hatching running from left to right. Step B3 indicates the portion of the tree representing blocks 1-5 in a final state where blocks 1 and 5 are unmodified, block 2 indicates that it has been updated with the First Data 2', and blocks 3 and 4 indicate that they have been updated with the Second Data 3" and 4". Note that block 3 is properly shown with the Second Data 3" and that the final states of all of the depicted sequences S1-S10 are the same regardless of the order of processing.

Sequence S2 is the same as sequence S1 except that the order of processing steps A3 and B1 are switched. At step B1, the instance of the restructure module 1204 servicing Request B invalidates the two nodes pointing to blocks 3 and 4. At step A3, the instance of the data location module 1302 servicing Request A updates the index with locations where 2' and 3' were stored, but the second node (2":3") and third node (4:5) remain invalid because the instance of the restructure module 1204 servicing Request B has not yet separated out 3 and 4 from the second and third nodes. Once the restructure module 1204 has restructured the nodes to include a node pointing to 3":4" leaving a node pointing to 2' and a node point to 5, the nodes pointing to 2' and 5 are in a final state. After step B3, which is the same as step B3 in sequence S1, the nodes of sequence S2 are in a final state and match the final state of sequence S1.

Figure 16A:
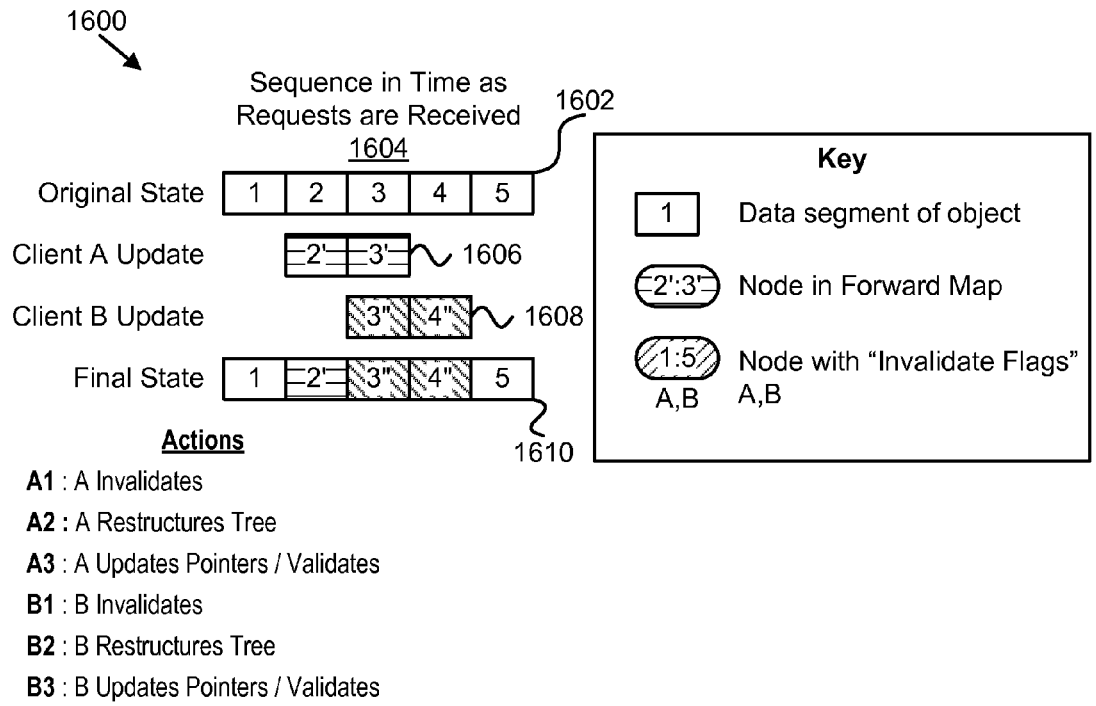
FIG. 16A is a first part of a schematic block diagram illustrating an example of an apparatus for coordinating storage requests in accordance with the present invention.
Figure 16A:
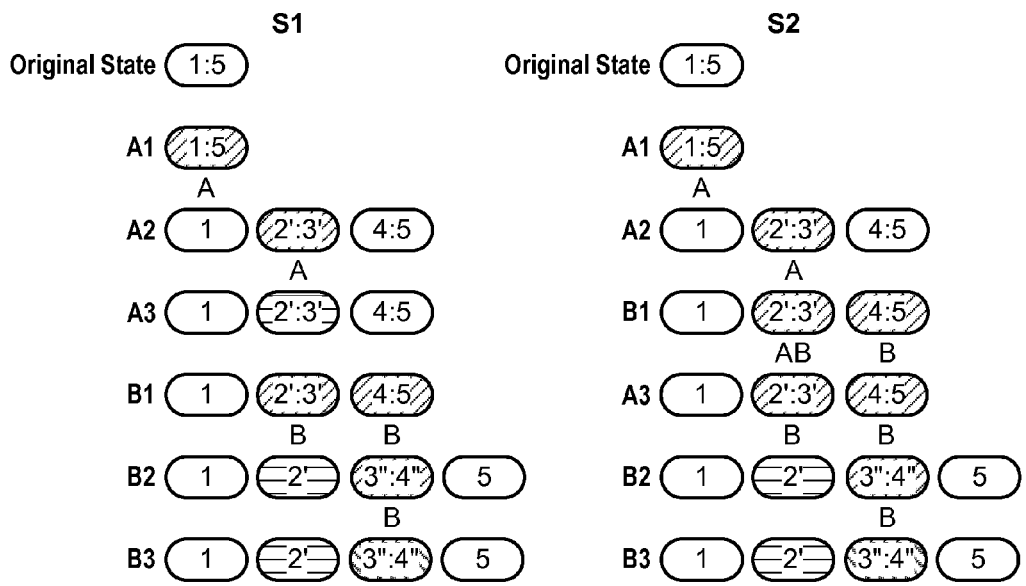
Figure 16B:
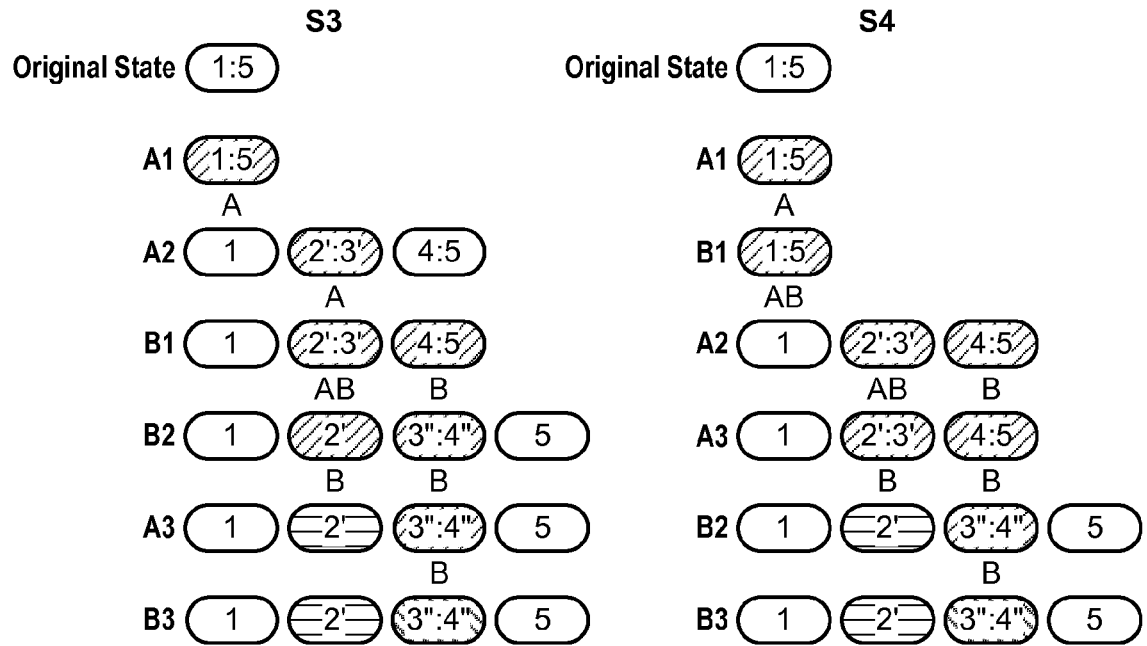
FIG. 16B is a second part of a schematic block diagram illustrating an example of an apparatus for coordinating storage requests in accordance with the present invention.
Figure 16B:
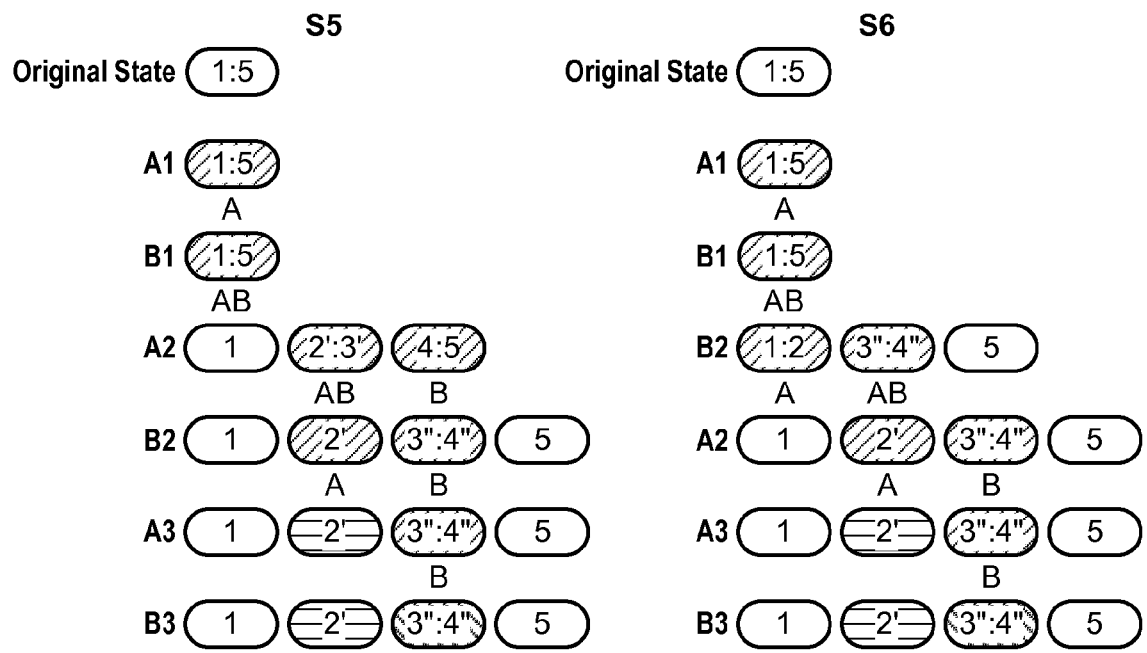
Figure 16C:
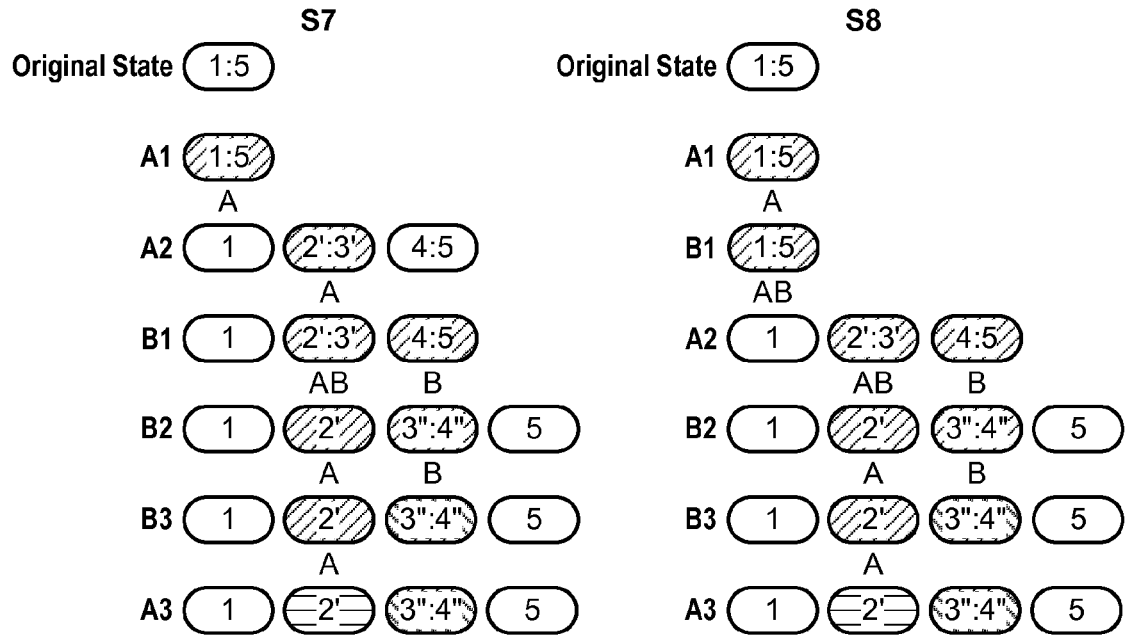
FIG. 16C is a third part of a schematic block diagram illustrating an example of an apparatus for coordinating storage requests in accordance with the present invention.
Figure 16C:
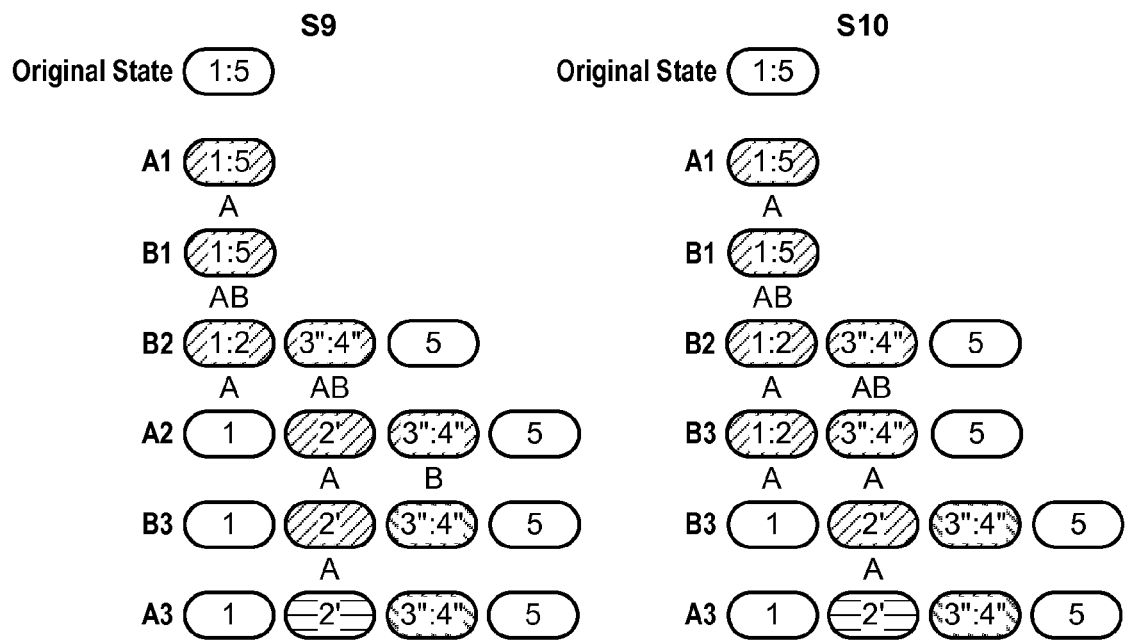

Sequences S3-S10, shown on FIGS. 16B and 16C, follow a procedure and analysis similar to that of sequences S1 and S2 except the steps are reordered. Note that in all sequences S1-S10, the final state is the same. The present invention beneficially allows multiple processors or multiple threads to access the same data segment stored on a common data storage device 106 or a data segment striped across an array of data storage devices 106. Beneficially, the present invention allows multiple processors or threads to have different completion times for servicing multiple service requests while maintaining data integrity. While two storage requests are shown, the present invention is also applicable to three or more concurrent storage requests accessing the same data segment. One of skill in the art will appreciate other benefits of the present invention and other ways to implement the modules 1202, 1204, 1302-1308 of the apparatus 1200, 1300.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to sequentially store data, the apparatus comprising:

a storage request receiver module that receives a storage request from a requesting device, the storage request comprising a source parameter for a data segment, the source parameter comprising a virtual address;

a translation module that translates the storage request to one or more append data storage commands, each append data storage command directing a nonvolatile solid-state data storage device to store data of the data segment and the source parameter at an append point of a sequential log, each append data storage command organized to maintain an order that data segments are received such that the sequential log stores the data segment in an order that the data segment is received, the translation module including a location of the append point in the one or more append data storage commands; and a mapping module that maps the source parameter of the data segment to a location of the data segment on the nonvolatile solid-state data storage device, the mapping module receiving, from the translation module, the location where the nonvolatile solid-state data storage device appends the data segment, the data segment and the source parameter stored in the sequential log such that the sequential log maintains a mapping between the source parameter and the location of the data segment on the nonvolatile solid-state data storage device.

2. The apparatus of claim 1, wherein storing the source parameter with the data of the data segment comprises storing the data of the data segment and the source parameter simultaneously at the append point of the sequential log.

3. The apparatus of claim 1, wherein the data of the data segment is stored as a data packet and wherein storing the source parameter with the data of the data segment comprises storing the source parameter in a data packet header, the data packet header stored together with the data of the data packet.

4. The apparatus of claim 1, further comprising a garbage collection module that moves valid data to the append point of the sequential log, wherein the mapping module remaps the source parameter of the valid data to a new location where the nonvolatile solid-state data storage device appends the valid data and the associated source parameter.

5. The apparatus of claim 1, wherein data segments are stored sequentially within a region of the nonvolatile solid-state data storage device and further comprising storing sequence information of the region that identifies when the region was written with data segments with respect to when other regions were written with data segments, wherein the sequential log comprises the sequence information of the regions and the sequence that data segments are stored in each region.

6. The apparatus of claim 1, wherein a physical location of the data of the data segment along with the source parameter stored with the data comprise a primary virtual-to-physical mapping persisted on the nonvolatile solid-state data storage device and the mapping created by the mapping module comprises a secondary virtual-to-physical mapping.

7. The apparatus of claim 6, further comprising an index rebuild module that rebuilds the secondary virtual-to-physical mapping created by the mapping module for the data segment, the index rebuild module rebuilding the mapping using the primary virtual-to-physical mapping by using the source parameter stored with the data of the data segment and using the physical location on the nonvolatile solid-state data storage device where the data of the data segment is stored.

8. The apparatus of claim 1, further comprising a storage response receiver module that receives a storage command response from the nonvolatile solid-state data storage device, the storage command response comprising a location where the nonvolatile solid-state data storage device appended the data of the data segment and associated source parameter.

9. The apparatus of claim 1, wherein the apparatus emulates a random access, logical block storage device storing data as directed by the storage request, wherein the virtual address of the data segment comprises a logical block address.

10. The apparatus of claim 9, wherein the source parameter comprises a virtual identifier in addition to the logical block address, the virtual identifier identifying a file or object of the data segment.

11. The apparatus of claim 1, further comprising a compression module that compresses data of an append data storage command prior to storage of the data on the nonvolatile solid-state data storage device, the append data storage command associated with the data segment.

12. The apparatus of claim 1, further comprising a command reordering module that modifies a sequence that two or more outstanding append data storage commands are executed.

13. The apparatus of claim 1, wherein the storage request receiver module receives two or more storage requests and further comprising a request reordering module that reorders a sequence that the two or more storage requests are serviced.

14. The apparatus of claim 1, wherein the source parameter further comprises at least one of a virtual identifier associated with the data segment, a device identifier, a partition identifier, lengths of one or more data packets of the data segment, one or more memory locations in a memory of a host where the data segment is located prior to or subsequent to the storage request, one or more lengths of data in the one or more memory locations, attributes of the data segment, metadata of the data segment, and control parameters of the data segment.

15. The apparatus of claim 1, wherein the source parameter includes one or more physical memory addresses where the data segment is read from as a result of the storage request.

16. The apparatus of claim 15, wherein at least one of the storage request and the one or more append data storage commands initiate one of a direct memory access ("DMA") process and a remote DMA ("RDMA") process to transfer data of the data segment to the nonvolatile solid-state data storage device.

17. The apparatus of claim 1, further comprising a response transmission module that transmits a storage request response to the requesting device, the storage request response comprising information regarding execution of the storage request.

18. A system to sequentially store data, the system comprising:
a nonvolatile solid-state data storage device; and
a storage controller controlling the nonvolatile solid-state data storage device, the storage controller comprising
a storage request receiver module that receives a storage request from a requesting device, the storage request comprising a source parameter for a data segment, the source parameter comprising a virtual address;
a translation module that translates the storage request to one or more append data storage commands, each append data storage command directing a nonvolatile solid-state data storage device to store data of the data segment and the source parameter at an append point of a sequential log, each append data storage command organized to maintain an order that data segments are received such that the sequential log stores the data segment in an order that the data segment is received, the translation module including a location of the append point in the one or more append data storage commands; and
a mapping module that maps the source parameter of the data segment to a location of the data segment on the nonvolatile solid-state data storage device, the mapping module receiving, from the translation module, the location where the nonvolatile solid-state data storage device appends the data segment, the data segment and the source parameter stored in the sequential log such that the sequential log maintains a mapping between the source parameter and the location of the data segment on the nonvolatile solid-state data storage device.

19. The system of claim 18, wherein the requesting device comprises a client in communication with the storage controller over a computer network.

20. The system of claim 19, wherein one or more of the storage request receiver module, the translation module, and the mapping module operate independent of the client.

21. The system of claim 18, further comprising a server, wherein the storage controller is within the server.

22. A method for sequentially storing data, the method comprising:

receiving a storage request from a requesting device, the storage request comprising a source parameter for a data segment, the source parameter comprising a virtual address;

translating the storage request to one or more append data storage commands, each append data storage command directing a nonvolatile solid-state data storage device to store data of the data segment and the source parameter at an append point of a sequential log, each append data storage command organized to maintain an order that data segments are received such that the sequential log stores the data segment in an order that the data segment is received;

receiving a storage command response from the nonvolatile solid-state data storage device, the storage command response comprising a location where the nonvolatile solid-state data storage device appended the data segment and associated source parameter; and mapping the source parameter of the data segment to the location of the data segment on the nonvolatile solid-state data storage device in response to receiving the location from the storage command response, the data segment and the source parameter stored in the sequential log such that the sequential log maintains a mapping between the source parameter and the location of the data segment on the nonvolatile solid-state data storage device.

23. The method of claim 22, further comprising moving valid data to the append point of the sequential log and remapping the source parameter of the valid data to a new location where the nonvolatile solid-state storage device appended the valid data and the associated source parameter.

24. The method of claim 22, further comprising rebuilding the mapping of the source parameter of the data segment to the location of the data segment on the nonvolatile solid-state data storage device using the source parameter stored with the data of the data segment in the sequential log and using a physical location on the nonvolatile solid-state storage device where the data of the data segment is stored.

25. The method of claim 22, wherein the data of the data segment is stored as a data packet and wherein storing the source parameter with the data of the data segment comprises storing the source parameter in a data packet header, the data packet header stored together with the data of the data packet.

26. The method of claim 22, wherein data segments are stored sequentially within a region of the nonvolatile solid-state data storage device and further comprising storing sequence information of the region that identifies when the region was written with data segments with respect to when other regions were written with data segments, wherein the sequential log comprises the sequence information of the regions and the sequence that data segments are stored in each region.

27. A method for sequentially storing data, the method comprising:

receiving a storage request from a requesting device, the storage request comprising a source parameter for a data segment;

translating, by a translation module, the storage request to one or more append data storage commands, each append data storage command directing a nonvolatile solid-state data storage device to store data of the data segment at an append point of a sequential log, each append data storage command organized to maintain an order that data segments are received such that the sequential log stores the data segment in an order that the data segment is received, the one or more append data storage commands including a location of the append point; and mapping, by a mapping module, the source parameter of the data segment to a location on the nonvolatile solid-state storage device in response to receiving, from the translation module, the location where the nonvolatile solid-state data storage device appends the data segment.

28. The method of claim 27, further comprising moving valid data to the append point of the sequential log and remapping the source parameter of the valid data to a new location where the nonvolatile solid-state storage device appends the valid data.

29. The method of claim 27, further comprising rebuilding the mapping of the source parameter of the data segment to the location on the nonvolatile solid-state data storage device using the source parameter stored with the data of the data segment in the sequential log and using a physical location on the nonvolatile solid-state storage device where the data of the data segment is stored.

30. The method of claim 27, wherein the data of the data segment is stored as a data packet and wherein the source parameter is stored in a data packet header, the data packet header stored together with the data of the data packet.

31. The method of claim 27, wherein data segments are stored sequentially within a region of the nonvolatile solid-state data storage device and further comprising storing sequence information of the region that identifies when the region was written with data segments with respect to when other regions were written with data segments, wherein the sequential log comprises the sequence information of the regions and the sequence that data segments are stored in each region.

* * * * *